United States Patent
Venkataramani et al.

(10) Patent No.: US 10,248,390 B1
(45) Date of Patent: Apr. 2, 2019

(54) RESOURCE SHARING WORKFLOWS WITHIN EXECUTABLE GRAPHICAL MODELS

(71) Applicant: The MathWorks, Inc., Natick, MA (US)

(72) Inventors: Girish Venkataramani, Boston, MA (US); Kiran Kintali, Ashland, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

(21) Appl. No.: 14/993,773

(22) Filed: Jan. 12, 2016

Related U.S. Application Data

(60) Division of application No. 14/245,629, filed on Apr. 4, 2014, now Pat. No. 9,298,862, which is a
(Continued)

(51) Int. Cl.
G06F 17/50 (2006.01)
G06F 8/35 (2018.01)
G06F 8/34 (2018.01)

(52) U.S. Cl.
CPC ............... *G06F 8/35* (2013.01); *G06F 8/34* (2013.01); *G06F 17/505* (2013.01); *G06F 17/5072* (2013.01); *G06F 17/5081* (2013.01)

(58) Field of Classification Search
CPC ..... G06F 17/50; G06F 17/505; G06F 17/5072; G06F 17/5077; G06F 17/5081
(Continued)

(56) References Cited

U.S. PATENT DOCUMENTS 5,164,724 A 11/1992 Hartley et al.
5,461,576 A * 10/1995 Tsay ..................... G06F 17/5072
716/113
(Continued)

FOREIGN PATENT DOCUMENTS

WO WO-2008033344 A2 3/2008

OTHER PUBLICATIONS

U.S. Appl. No. 12/963,433, filed Dec. 8, 2010 by Girish Venkataramani, et al. for a Hardware Definition Language Generation for Data Serialization From Executable Graphical Models, pp. 1-78.
(Continued)

*Primary Examiner* — Phallaka Kik
(74) *Attorney, Agent, or Firm* — Cesari and McKenna, LLP; Michael R. Reinemann

(57) ABSTRACT

A system and method optimizes hardware description generated from a graphical program or model automatically. The system may include a streaming optimizer, a resource sharing optimizer and a delay balancing engine. The streaming optimizer transforms one or more vector data paths in the source model to scalar data paths or to a smaller-sized vector data paths. The resource sharing optimizer may replace multiple blocks of the source model that are functionally equivalent with a single shared block. The streaming and resource sharing optimizers may also configure portions of the modified model to execute at a faster rate. The delay balancing engine may examine the modified model to determine whether any delays or latencies have been introduced. If so, the delay balancing engine may insert one or more blocks into the modified model to correct for any data path misalignment caused by the introduction of the delays or latencies. A validation model, a report, or hardware description code that utilizes fewer hardware resources may be generated from the modified model.

23 Claims, 26 Drawing Sheets

Related U.S. Application Data continuation of application No. 12/963,371, filed on Dec. 8, 2010, now Pat. No. 8,694,947.

(60) Provisional application No. 61/267,902, filed on Dec. 9, 2009.

(58) Field of Classification Search
USPC ........ 716/100, 104, 105, 108, 111, 116, 122, 716/124, 125, 131, 132; 703/16
See application file for complete search history.

(56) References Cited

U.S. PATENT DOCUMENTS

| | | | |
|---|---|---|---|
| 5,701,294 A | 12/1997 | Ward et al. | |
| 5,764,951 A | 6/1998 | Ly et al. | |
| 5,920,711 A | 7/1999 | Seawright et al. | |
| 5,923,653 A | 7/1999 | Denton | |
| 5,956,674 A | 9/1999 | Smyth et al. | |
| 6,118,902 A | 9/2000 | Knowles | |
| 6,128,025 A | 10/2000 | Bright et al. | |
| 6,216,252 B1 | 4/2001 | Dangelo et al. | |
| 6,298,471 B1 * | 10/2001 | Schreiber | G06F 17/5045 716/108 |
| 6,505,339 B1 | 1/2003 | Miller et al. | |
| 6,513,043 B1 | 1/2003 | Chan et al. | |
| 6,584,601 B1 | 6/2003 | Kodosky et al. | |
| 6,651,222 B2 | 11/2003 | Gupta et al. | |
| 7,143,368 B1 | 11/2006 | Plofsky et al. | |
| 7,178,112 B1 | 2/2007 | Ciolfi et al. | |
| 7,376,544 B1 | 5/2008 | Dick et al. | |
| 7,428,737 B1 | 9/2008 | Borghesani et al. | |
| 7,584,465 B1 | 9/2009 | Koh | |
| 7,698,668 B2 | 4/2010 | Balasubramanian | |
| 7,720,662 B1 | 5/2010 | Aldrich | |
| 7,882,462 B2 | 2/2011 | Ogilvie et al. | |
| 7,895,584 B1 | 2/2011 | Ma et al. | |
| 7,983,879 B1 | 7/2011 | Vetsch et al. | |
| 8,046,386 B2 | 10/2011 | Taitel | |
| 8,122,238 B2 | 2/2012 | Kassas | |
| 8,156,459 B1 | 4/2012 | Ou | |
| 8,352,505 B1 | 1/2013 | Venkataramani | |
| 8,365,141 B1 | 1/2013 | Yan | |
| 8,402,409 B1 | 3/2013 | Janneck et al. | |
| 8,413,088 B1 | 4/2013 | Armbruster | |
| 8,504,978 B1 * | 8/2013 | Bhardwaj | G06F 17/5036 716/106 |
| 8,533,642 B1 | 9/2013 | Ogilvie | |
| 8,694,947 B1 | 4/2014 | Venkataramani et al. | |
| 8,863,069 B1 | 10/2014 | Venkataramani et al. | |
| 8,914,262 B2 | 12/2014 | Zhang | |
| 8,935,137 B1 | 1/2015 | Han | |
| 9,251,308 B2 | 2/2016 | Kajitani | |
| 9,436,441 B1 | 9/2016 | Venkataramani | |
| 9,817,931 B1 | 11/2017 | Gu et al. | |
| 9,971,633 B1 | 5/2018 | Barsness et al. | |
| 10,062,422 B2 * | 8/2018 | Wingard | G06F 12/0607 |
| 2001/0025292 A1 | 9/2001 | Denk et al. | |
| 2001/0053069 A1 * | 12/2001 | Haba | G06F 13/409 361/760 |
| 2002/0080174 A1 | 6/2002 | Kodosky et al. | |
| 2002/0120909 A1 | 8/2002 | Brouhard | |
| 2002/0193078 A1 | 12/2002 | MacFarlane Shearer et al. | |
| 2003/0016234 A1 | 1/2003 | Mani et al. | |
| 2003/0215017 A1 | 11/2003 | Fang | |
| 2004/0049596 A1 | 3/2004 | Schuehler et al. | |
| 2004/0243964 A1 | 12/2004 | McElvain et al. | |
| 2006/0064670 A1 | 3/2006 | Linebarger | |
| 2006/0120189 A1 * | 6/2006 | Beerel | G06F 17/5059 365/203 |
| 2006/0225021 A1 | 10/2006 | Padalia et al. | |
| 2007/0058572 A1 | 3/2007 | Clauberg | |
| 2007/0113209 A1 | 5/2007 | Park et al. | |
| 2007/0150855 A1 | 6/2007 | Jeong | |
| 2007/0277161 A1 | 11/2007 | Herbordt et al. | |
| 2008/0098349 A1 | 4/2008 | Lin et al. | |
| 2008/0189089 A1 | 8/2008 | Lee | |
| 2008/0198938 A1 | 8/2008 | Lee et al. | |
| 2008/0201690 A1 | 8/2008 | Lovisa et al. | |
| 2008/0234995 A1 | 9/2008 | Newcomb et al. | |
| 2009/0013301 A1 | 1/2009 | Ogilvie | |
| 2009/0128189 A1 | 5/2009 | Madurawe et al. | |
| 2009/0193239 A1 | 7/2009 | Hanai | |
| 2010/0293342 A1 | 11/2010 | Morfey | |
| 2011/0225572 A1 | 9/2011 | Stoicescu et al. | |
| 2013/0116987 A1 | 5/2013 | Zhang | |
| 2018/0011706 A1 | 1/2018 | Bucuvalas et al. | |

OTHER PUBLICATIONS

U.S. Appl. No. 12/963,371, filed Dec. 8, 2010 by Girish Venkataramani, et al. for a Resource Sharing Workflows Within Executable Graphical Models, pp. 1-79.

Karris, Steven T., "Introduction to Simulink® with Engineering Applications Second Edition," Orchard Publications, 2006, pp. 1-44.

Klauske, Lars K. et al., "Improving Modeling Usability: Automated Layout Generation for Simulink," Jun. 16, 2010, pp. 1-8.

"Lecture Notes," Imperial College, Department of Electrical and Electronic Engineering, Jan. 31, 2006, pp. 1-5.

Simulink® 7 User's Guide—Matlab & Simulink—The MathWorks—Mar. 2010, pp. 1-1616.

"Simulink User's Guide: R2012b," The MathWorks, Inc., Sep. 2012, pp. 1-2839.

Zacher, Darren, "How to Use Register Retiming to Optimize Your FPGA Designs," Mentor Graphics, <http://www.eetimes.com/design/programmable-logic/4014801/How-to-use-register-retiming-to-optimize-your-FPGA-designs>, EE Times Group a UBM company, Dec. 14, 2005, pp. 1-5.

Acosta, Alfonso, "ForSyDe: Rising the Abstraction Level in System Design," Royal Institute of Technology, Stockholm, Sweden, Mar. 27, 2008, pp. 1-98.

"Actel Digital Signal Processing (DSP) Solution," Actel Corporation, <http://web.archive.org/web/20071028055746/www.actel.com/products/solutions/dsp/default.aspx>, Oct. 11, 2007, pp. 1-5.

Akella, Sreesa, "Guidelines for Design Synthesis Using Synopsys Design Compiler," Department of Computer Science Engineering University of South Carolina, Columbia, South Carolina, Dec. 2000, pp. 1-13.

Banerjee, Prithviraj et al., "Overview of a Compiler for Synthesizing MATLAB Programs onto FPGAs," IEEE Transactions on Very Large Scale Integration (VLSCI) Systems, vol. 12(3):312-324 (2004).

Bjureus, Per et al., "FPGA Resource and Timing Estimation from Matlab Execution Traces," International Conference on Hardware Software Codesign, Proceedings of the tenth international symposium on Hardware/software codesiqn, pp. 31-36 (2002).

Goering, Richard, "MathWorks Moving Deeper into IC Design," Sep. 18, 2006, pp. 1-3.

Haldar, Malay et al., "FPGA Hardware Synthesis from MATLAB," Fourteenth International Conference on VLSI Design, pp. 299-304 (Jan. 2001).

International Search Report for Application No. PCT/US2007/019734, dated Nov. 11, 2008.

Martins, Sergio et al., "A high-level tool for the design of custom image processing systems," Proceedings of the 2005 8th Euromicro conference on Digital System Design (OSO'05), pp. 346-349 (Sep. 2005).

"MathWorks™ Products for Signal Processing and Communications," The MathWorks, Inc., Mar. 2008, pp. 1-4.

Nayak, Anshuman et al., "Accurate Area and Delay Estimators for FPGAs," Proceedings of the 2002 Design, Automation and Test in Europe Conference and Exhibition (DATE'02), pp. 862-869 (2002).

Ou, Jingzhao et al., "PyGen: A MATLAB/Simulink Based Tool for Synthesizing Parameterized and Energy Efficient Designs Using FPGAs," Proceedings of the 12th Annual IEEE Symposium on Field-Programmable Custom Computing Machines, pp. 47-56 (Apr. 2004).

(56) References Cited

OTHER PUBLICATIONS

Popinchalk, Seth, "Building Accurate, Realistic Simulink Models," Newsletters, The MathWorks, Inc., 2006, pp. 1-10.
Popinchalk, Seth, "Improving Simulation Performance in Simulink," The MathWorks, Inc., <http://www.eetimes.com/General/PrintView/4087424>, Apr. 2012, pp. 1-10.
Portero, Antoni et al., "Study of High Level design methodologies for a MPEG frames I Compressor for a HW/SW Implementation," 2004 IEEE International Conference on Industrial Technology (ICIT), DOS. 1688-1693 (Dec. 2004).
"Precision RTL Synthesis Users Manual," 2003c Update 1, Mentor Graphics Corporation, Mar. 2004, pp. 1-119.
Raudvere, Tarvo, et al., "Application and Verification of Local Nonsemantic-Preserving Transformations in System Design," IEEE Transactions on Computer-Aided Design of Integrated Circuits and Systems, vol. 27, No. 6, Jun. 2008, pp. 1-13.
Sander, Ingo, "System Modeling and Design Refinement in ForSyDe," Royal Institute of Technology, Stockholm, Sweden, Apr. 2003, pp. 1-244.
Simulink® HDL Coder™ 1: User's Guide, The MathWorks, Inc., Mar. 2008, pp. 1-552.
Simulink® 7: User's Guide, The MathWorks, Inc., Sep. 2009, pp. 1-1528.
U.S. Appl. No. 14/245,629, filed Apr. 4, 2014 by Girish Venkataramani, et al. for a Resource Sharing Workflows Within Executable Graphical Models, pp. 1-82.
"Working With Xilinx® Devices and Place and Route Tools," Altium, AP0112 (v1.0), Jan. 13, 2004, pp. 1-6.
Simulink®: User's Guide, R2015b, The MathWorks, Inc., Sep. 2015, pp. 1-3480.

\* cited by examiner

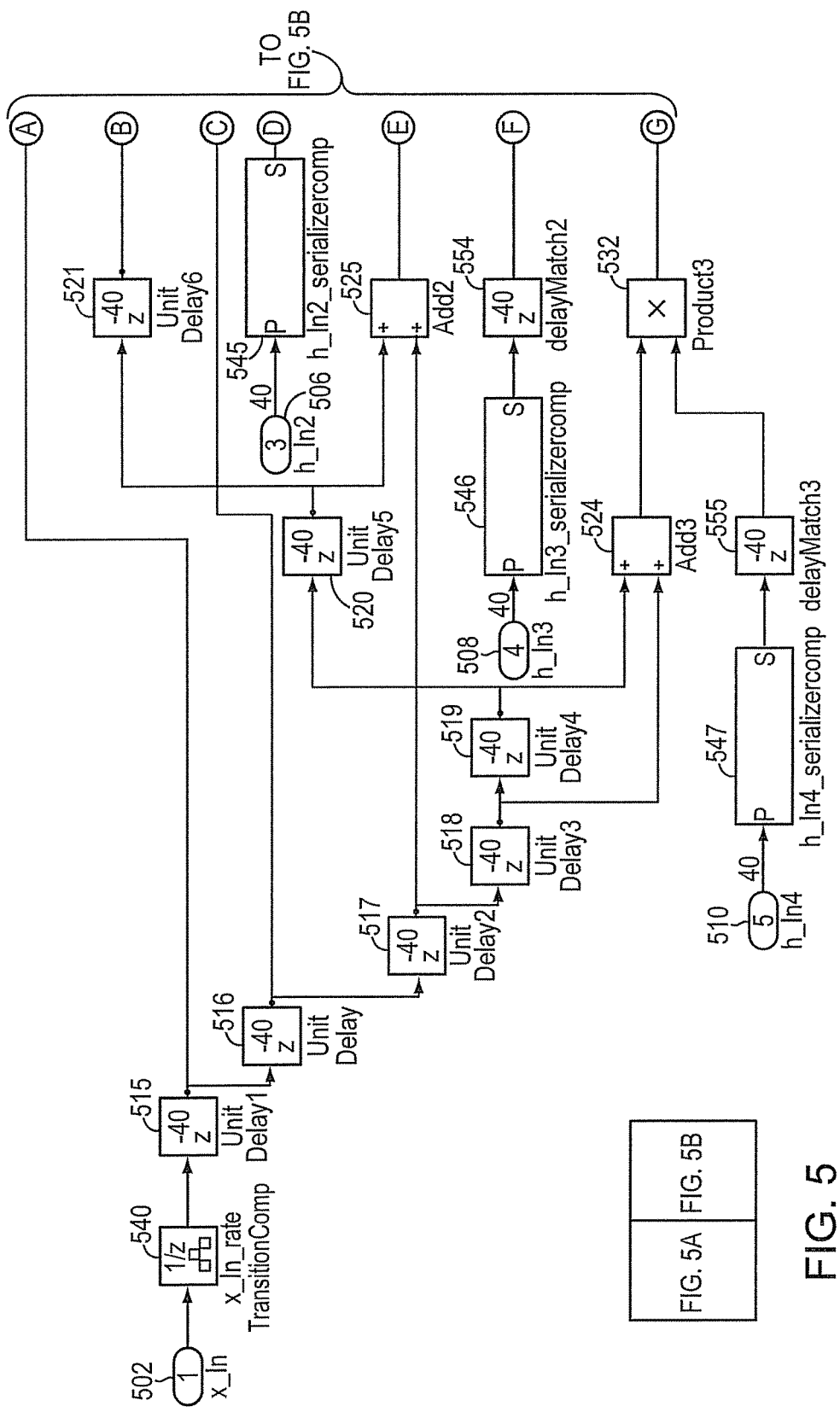

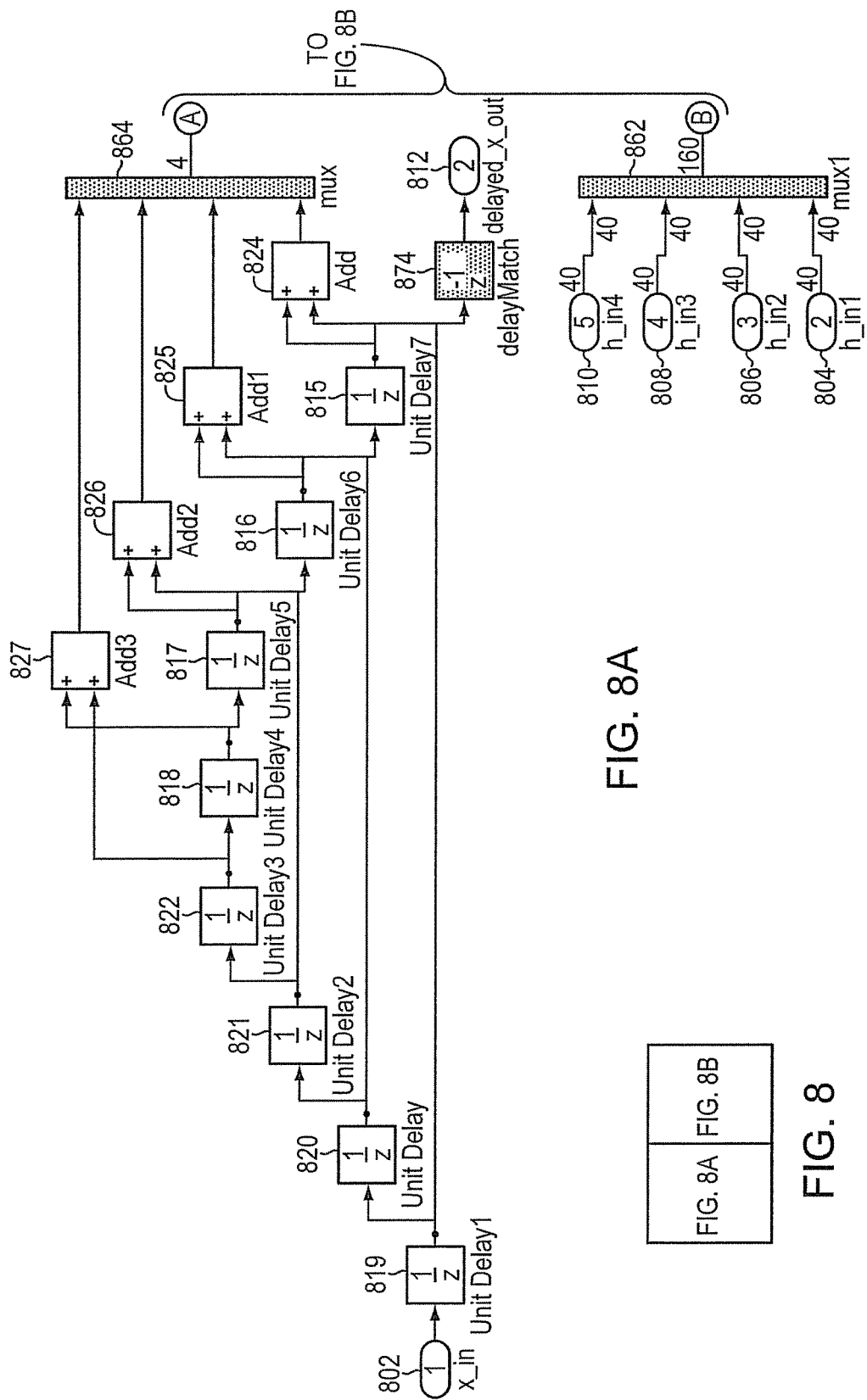

RESOURCE UTILIZATION REPORT ─1000

SUMMARY  1002

| MULTIPLIERS | 3 |
| ADDERS/SUBTRACTORS | 2 |
| REGISTERS | 210 |

DETAILED REPORT

[Expand all] [Collapse all]

REPORT FOR SUBSYSTEM: CONTROLLER

MULTIPLIERS (3)

[ + ] 8x8-bit Multiply : 2
[ + ] 32x8-bit Multiply : 1          1004

ADDERS/SUBTRACTORS (2)

[ + ] 32x32-bit Adder : 1
[ + ] 32x32-bit Subtractor : 1

REGISTERS (210)

1-bit Register : 3
[ + ] 8-bit Register : 207

FIG. 10

RESOURCE SHARING WORKFLOWS WITHIN EXECUTABLE GRAPHICAL MODELS

CROSS-REFERENCE TO RELATED APPLICATIONS

This application is a divisional of application Ser. No. 14/245,629, filed Apr. 4, 2014, which application is a continuation of application Ser. No. 12/963,371, filed Dec. 8, 2010 for Resource Sharing Workflows Within Executable Graphical Models, now U.S. Pat. No. 8,694,947, which claims the benefit of U.S. Provisional Patent Application Ser. No. 61/267,902, filed Dec. 9, 2009, by Girish Venkataramani, Kiran Kintali, and Vijaya Raghavan for an AUTOMATIC SERIALIZATION, which applications are hereby incorporated by reference in their entireties.

BACKGROUND OF THE INVENTION

Field of the Invention

The present invention relates to code generation and, more specifically, to generating optimized code.

Background Information

Engineers, scientists and other users often work with computer-based, high-level development tools or environments to perform algorithm development, data visualization, simulation, and model design, among other tasks. Exemplary high-level development tools include the MATLAB® and Simulink® technical computing environments from The MathWorks, Inc. of Natick, Mass. With the Simulink® technical computing environment, a user creates an executable graphical model by selecting blocks from a library browser, placing them onto a canvas, for example in a graphical editor, and connecting them with lines that establish mathematical relationships and/or signals between the blocks. The Stateflow® modeling environment is an extension to the Simulink® technical computing environment that allows a user to specify state machines and flow charts. A Stateflow chart may be created by selecting states, junctions, and functions from a graphical palette, and entering them into a drawing window. The user can then create transitions by connecting states and junctions together.

Other add-on products or tools exist for generating code from Simulink models, MATLAB files and/or functions, often referred to as M-files and/or M-functions, and/or Stateflow charts. Specifically, a Simulink Hardware Description Language (HDL) Coder™ add-on product, also available from The MathWorks, Inc., generates HDL code based on Simulink models or Stateflow charts. The generated HDL code can be exported to synthesis and layout tools for hardware realization onto target hardware, such as Field Programmable Gate Arrays (FPGAs), Application Specific Integrated Circuits (ASICs), Complex Programmable Logic Devices (CPLDs), etc. With the release of the Simulink HDL Coder add-on product, the Simulink technical computing environment can now be used for electronic design automation, and other design and exploration functions.

SUMMARY OF THE INVENTION

In an embodiment, a method includes receiving an executable source graphical model that executes over steps of the model. The model has a number of data paths that include interconnected blocks. An in-memory representation is generated from the model. The in-memory representation has a number of functional components or nodes that correspond to the model's blocks. A set of nodes that are functionally equivalent with each other are identified in the in-memory representation. An optimization engine modifies the in-memory representation automatically to produce an optimized version. Specifically, the set of functionally equivalent nodes are replaced with a single shared node. A multiplexer and a demultiplexer are inserted into the in-memory representation, and connected to the single shared node. The single shared node, the multiplexer, and the demultiplexer are then configured to operate at clock rates that are higher than the rate associated with the model's steps. This optimized in-memory representation may then be used to generate a validation model, a report or a hardware description.

BRIEF DESCRIPTION OF THE DRAWINGS

The invention description below refers to the accompanying drawings, of which:

FIG. 5 is a smaller scale view indicating the positions of FIGS. 5A and 5B to form a whole view;

FIGS. 5A and 5B are partial views of a schematic illustration of a validation model in accordance with an embodiment of the present invention;

FIG. 6 is a smaller scale view indicating the positions of FIGS. 6A and 6B to form a whole view;

FIG. 8 is a smaller scale view indicating the positions of FIGS. 8A and 8B to form a whole view;

FIGS. 8A and 8B are partial views of a schematic illustration of a validation model in accordance with another embodiment of the present invention;

FIG. 10 is a schematic illustration of a resource report for an optimized version of the source model corresponding to FIG. 9;

DETAILED DESCRIPTION OF ILLUSTRATIVE EMBODIMENTS

Overview

Figure 1:
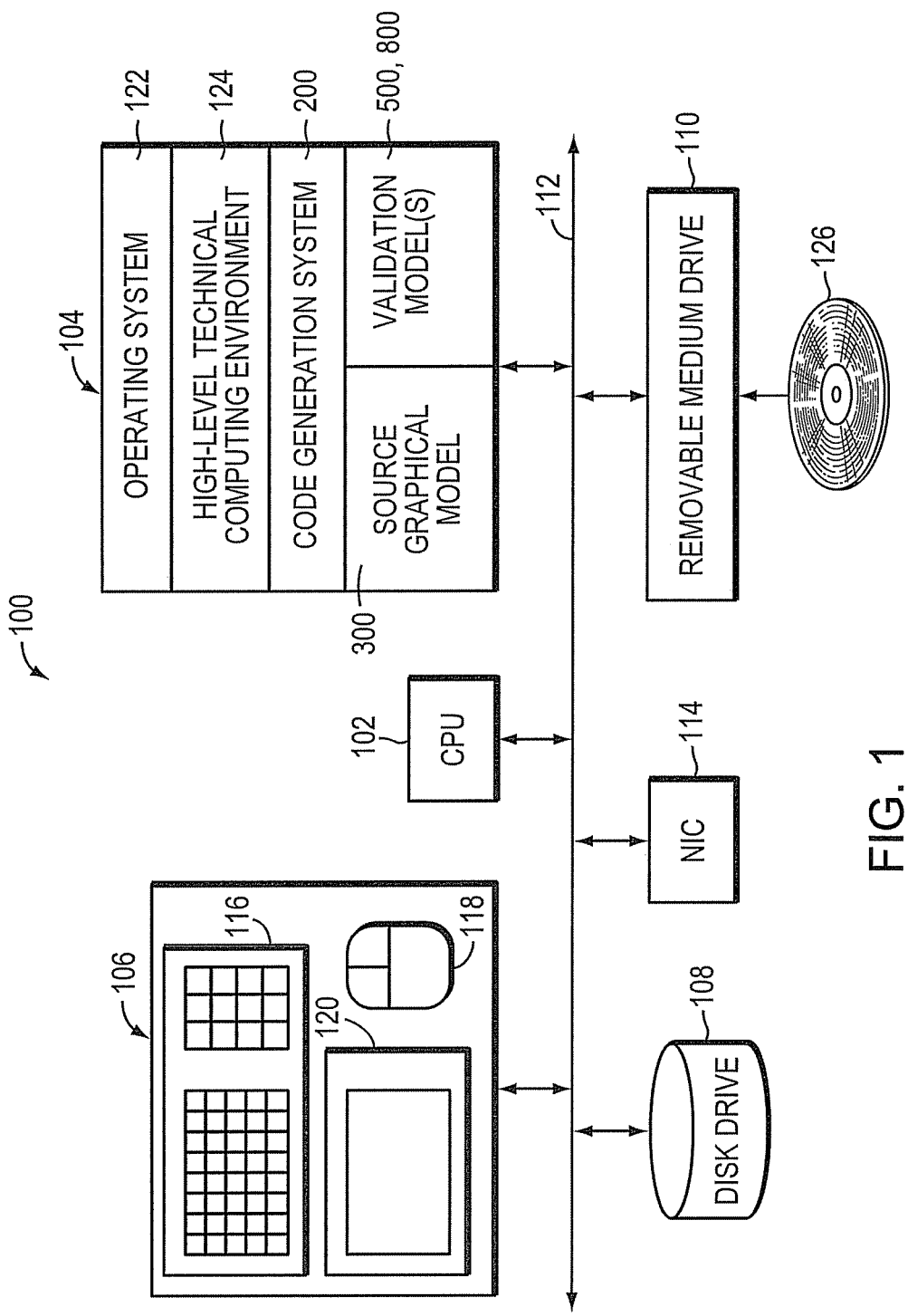
FIG. 1 is a schematic block diagram of a computer system suitable for use with the present invention.

Briefly, the present invention relates to a system and method for optimizing code, such as a hardware description code, generated from a source graphical program or model automatically. In a first aspect, the present invention includes a streaming optimizer that is configured to evaluate at least a portion of the source model, and to transform one or more vector data paths in the source model to scalar data paths or to a smaller-sized vector data paths. The streaming optimizer also configures the transformed data paths to execute at a faster rate relative to the respective portion of the original source model. In an embodiment, the streaming optimizer automatically inserts one or more Serializer blocks into the model or an in-memory representation of the source model that convert vector data to scalar data, or to a smaller-sized vector. The streaming optimizer may also insert one or more Deserializer blocks into the model or an in-memory representation of the source model that convert scalar data or a smaller-sized vector back into vector data. The in-memory representation may be an Intermediate Representation (IR) whose architecture and format is suited for use in generating both hardware description code and an executable graphical model.

In another aspect of the present invention, a resource sharing optimizer may search at least a portion of the source model (or the IR) for a set of blocks that implement equivalent functionality. The resource sharing optimizer may then modify the source model, for example as represented by the IR, by replacing part of or the entire set of equivalent blocks with a single shared block. The resource sharing optimizer may further modify the source model by inserting one or more Multiplexer (Mux) blocks, and routing the input data paths of the removed blocks to the one or more Mux blocks. The output of the one or more Mux blocks may feed the single shared block, and the output of the single shared block may be coupled to one or more Demultiplexer (Demux) blocks inserted in the model by the resource sharing optimizer. The outputs of the one or more Demux blocks may be routed to the output data paths of the removed blocks. The resource sharing optimizer may also insert one or more Serializer blocks and Deserializer blocks into the data paths being modified, and configure the modified portion of the model to execute at a faster rate.

In a further aspect of the present invention, a delay balancing engine may cooperate with the streaming optimizer and the resource sharing optimizer, and determine whether the modifications made by either entity introduce any delays or latencies in the model. If so, the delay balancing engine may modify existing blocks of the model, such as Delay blocks, or insert additional blocks, such Rate Transition blocks or other Delay blocks, into one or more data paths of the version of the model being optimized in order to ensure that any delays or latencies are accounted for. More specifically, the delay balancing engine may ensure that parallel data paths of the model remain aligned with each other as specified in the source model.

In another aspect of the present invention, the system or method includes a validation model generator that creates an executable, graphical validation model from the IR as modified by the streaming and resource sharing optimizers and the delay balancing engine. The validation model, which may be presented to a user, e.g., on a display of a workstation, provides a visual indication of the modifications that were made to the source model. Furthermore, the source and validation models may be part of a validation environment that may be operated by the user to confirm that the validation model, which represents the optimized version of the source model, and the source model both produce the identical results.

In an embodiment, the optimizations performed by the streaming and resource sharing optimizers are user-configurable. Specifically, the degree or level of optimization performed by the streaming and resource sharing optimizers is a function of one or more settable parameters. The user may adjust these settable parameters and repeat the process to evaluate or explore various optimization alternatives. In an embodiment, a report generator evaluates each IR as modified by the streaming and resource sharing optimizers, and produces a summary of the hardware resources that would be required to implement the modified IR in hardware. The user may examine these reports, and select a particular optimization that achieves one or more goals or objectives of the user. The evaluation of different optimizations may be made without generating any hardware description code. In an embodiment, the user may wait until an appropriate optimization of the source model is achieved before generating hardware description code from the optimized version of the source model.

When the user has settled on a particular optimization of the source model, the user may have hardware description code generated from the modified IR that was selected. A code generation engine is configured to generate hardware description code, such as Hardware Description Language (HDL) code, e.g., VHDL, Verilog, or SystemC, from the modified IR that remains bit true and cycle accurate to the source model. It should be understood that the cycle accuracy of the generated hardware description relative to the execution of the source or original model is modulo a pre-determined initial latency. The generated hardware description code may include elements representing the Serializer, Deserializer, Delay and Rate Transition blocks added to the source model by the streaming and resource sharing optimizers and the delay balancing engine. Nonetheless, the generated hardware description code results in fewer physical resources being consumed on the target hardware than might otherwise be needed to implement the source model directly in hardware.

FIG. 1 is a schematic illustration of a computer or data processing system 100 for implementing and utilizing an embodiment of the invention. The computer system 100 includes one or more processing elements, such as a central processing unit (CPU) 102, a main memory 104, user input/output (I/O) 106, a disk drive 108, and a removable medium drive 110 that are interconnected by a system bus 112. The computer system 100 may also include a network interface card (NIC) 114. The user I/O 106 may include a keyboard 116, a mouse 118 and a display 120.

The main memory 104 may store a plurality of libraries or modules, such as an operating system 122, and one or more applications running on top of the operating system 122, including a technical computing environment 124. The main memory 104 may also include a code generation system 200. The code generation system 200 may be configured as a toolbox or an add-on product to the high-level technical computing environment 124. Furthermore, as described herein, the main memory 104 may include a program specification, such as a source graphical model 300, and a validation model 500.

The removable medium drive 110 is configured to accept and read a computer readable medium 126, such as a CD, DVD, floppy disk, solid state drive, tape, flash memory or other medium. The removable medium drive 110 may further be configured to write to the computer readable medium 126.

Suitable computer systems include personal computers (PCs), workstations, laptops, tablets, palm computers and other portable computing devices, etc. Nonetheless, those skilled in the art will understand that the computer system 100 of FIG. 1 is intended for illustrative purposes only and that the present invention may be used with other computer systems, data processing systems or computational devices. The present invention may also be used in a networked, e.g., client-server, computer architecture, or a public and/or private cloud computing arrangement.

Suitable operating systems 122 include the Windows series of operating systems from Microsoft Corp. of Redmond, Wash., the Linux operating system, the MAC OS® series of operating systems from Apple Inc. of Cupertino, Calif., and the UNIX® series of operating system, among others.

As indicated above, a user or developer, such as an engineer, scientist, programmer, etc., may utilize the keyboard 116, the mouse 118 and the computer display 120 of the user I/O 106 to operate the high-level technical computing environment 124, and create the source graphical model 300.

Suitable high-level technical computing environments for use with embodiments of the present invention include the MATLAB® and SIMULINK® technical computing environments from The MathWorks, Inc. of Natick, Mass., the LabVIEW programming system from National Instruments Corp. of Austin, Tex., and the Visual Engineering Environment (VEE) from Agilent Technologies, Inc. of Santa Clara, Calif., a Unified Modeling Language (UML) system, a Systems Modeling Language (SysML) system, and System Generator from Xilinx, Inc., among others. Those skilled in the art will recognize that the computer system 100 need not include any software development environment at all.

The high-level technical computing environment 124 may include a simulation engine (not shown) configured to simulate, e.g., execute, block diagrams or models, such as the source graphical model 300, on the computer 100. That is, icons or blocks of the model may represent computations, functions or operations, and interconnecting lines or arrows among those blocks may represent data, signals or relationships among those computations, functions or operations. The icons or blocks, moreover, may be selected by the user from one or more libraries or palettes that contain icons or blocks for the blocks supported by the high-level technical computing environment 124. The high-level technical computing environment 124 may include or support a graphical user interface (GUI) having a Run button that may be selected by the user. The high-level technical computing environment 124 may also be configured to receive a run command entered by the user, e.g., in the GUI or in a Command Line Interface (CLI). In response to the user selecting the Run button or entering the run command, the simulation engine of the high-level technical computing environment 124 may execute the model, and may present the results of the model's execution to the user via the display 120.

The high-level technical computing environment 124 may further include one or more debugging facilities that may, for example, allow halting a simulation at one or more breakpoints. A breakpoint may be specified for a variable, for example, to halt execution when the variable value changes. A breakpoint also may be conditional, for example, only halting execution when a variable value changes if the current time of execution is in a certain time interval, or only halting execution when a variable has changed a specified number of times.

A suitable simulation engine includes the simulation engine included in the Simulink modeling environment, the execution engine of the LabVIEW programming system, and the execution engine of the Agilent VEE programming system, among others.

The high-level technical computing environment 124, moreover, may include or support a graphical user interface (GUI) having a Code Generation button that may be selected by the user. The high-level technical computing environment 124 may also be configured to receive a code generation command entered by the user, e.g., in the GUI or in a Command Line Interface (CLI). In response to the user selecting the Code Generation button or entering the code generation command, the code generation engine of the high-level technical computing environment 124 may generate code for at least part of the model, and may present the results of the code generation to the user via the display 120.

Those skilled in the art will understand that the MATLAB® technical computing environment is a math-oriented, textual programming environment for digital signal processing (DSP) design, among other uses. The SIMULINK® technical computing environment is a graphical, block-based environment for modeling and simulating dynamic systems, among other uses.

Figure 2:
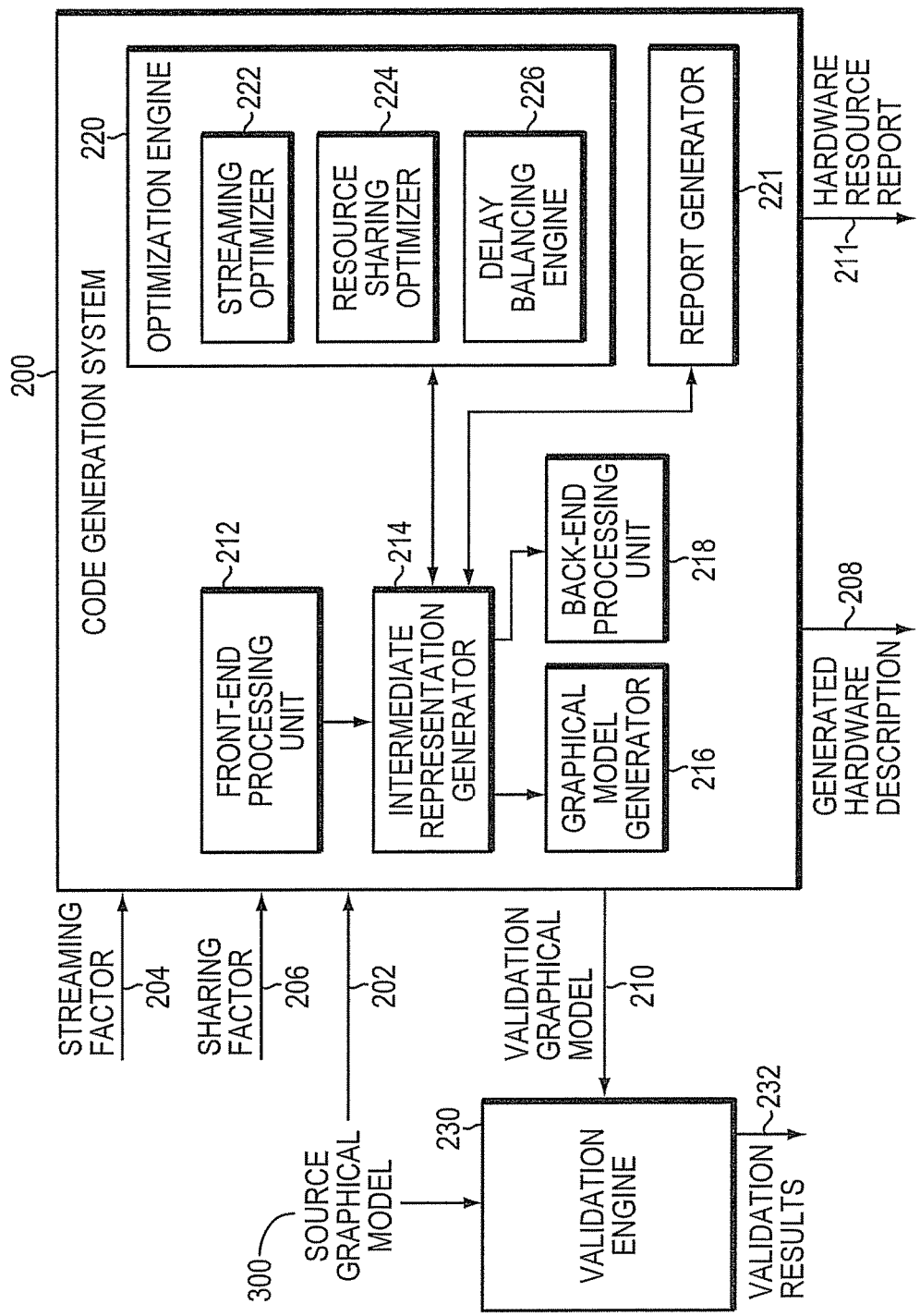
FIG. 2 is a schematic block diagram of a code generation system in accordance with an embodiment of the present invention.

FIG. 2 is a highly schematic, functional block diagram of an embodiment of the code generation system 200. The code generation system 200 may receive the source graphical model 300 created by the user or developer with the high-level technical computing environment 124, as indicated by arrow 202. The source graphical model 200 may be a Simulink model, a Stateflow chart, a LabVIEW block diagram, a VEE diagram, etc. The code generation system 200 also may receive a streaming factor specified by the user or developer, as indicated by arrow 204, and a sharing factor specified by the user or developer, as indicated by arrow 206. As described herein, the code generation system 200 may produce hardware description code corresponding to the source graphical model, as indicated by arrow 208, that is optimized, and yet remains bit true and cycle accurate (modulo a well-defined initial latency) to the simulation of the source graphical model. Exemplary hardware descriptions that may be generated include hardware description language (HDL) code, such as VHDL or Verilog code, SystemC code, embedded MATLAB code, vendor or target specific HDL code, such as Xilinx FPGA libraries, etc. The code generation system 200 may also produce one or more validation models, as indicated by arrow 210, and one or more hardware resource reports, as indicated by arrow 211.

The code generation system 200 may include a plurality of components or modules. Specifically, the code generation system 200 may include a front-end processing unit 212, an intermediate representation (IR) generator 214, a graphical model generator 216, a back-end processing unit 218, an optimization engine 220, and a report generator 221. The optimization engine 220, in turn, may include one or more sub-components or modules, such as a streaming optimizer 222, a resource sharing optimizer 224, and a delay balancing engine 226. The code generation system 200 may include or have access to, e.g., be in communication with, a validation engine 230. As described herein, the validation engine, which may be part of the high-level technical computing environment 124, may receive the source and validation models, and produce validation results, as indicated by arrow 232.

The front-end processing unit 212, the IR generator 214, the graphical model generator 216, the back-end processing unit 218, the optimization engine 220, and the report generator 221 may each comprise registers and combinational logic configured and arranged to produce sequential logic circuits. In the illustrated embodiment, the front-end processing unit 212, the IR generator 214, the graphical model generator 216, the back-end processing unit 218, the optimization engine 220, and the report generator 221 are implemented through one or more software modules or libraries containing program instructions pertaining to the methods described herein, that may be stored on main memory 104 and/or computer readable media, such as computer readable medium 126, and executable by one or more processing elements, such as CPU 102. Other computer readable media may also be used to store and execute these program instructions. In alternative embodiments, various combinations of software and hardware, including firmware, may be utilized to implement the present invention.

Figure 3:
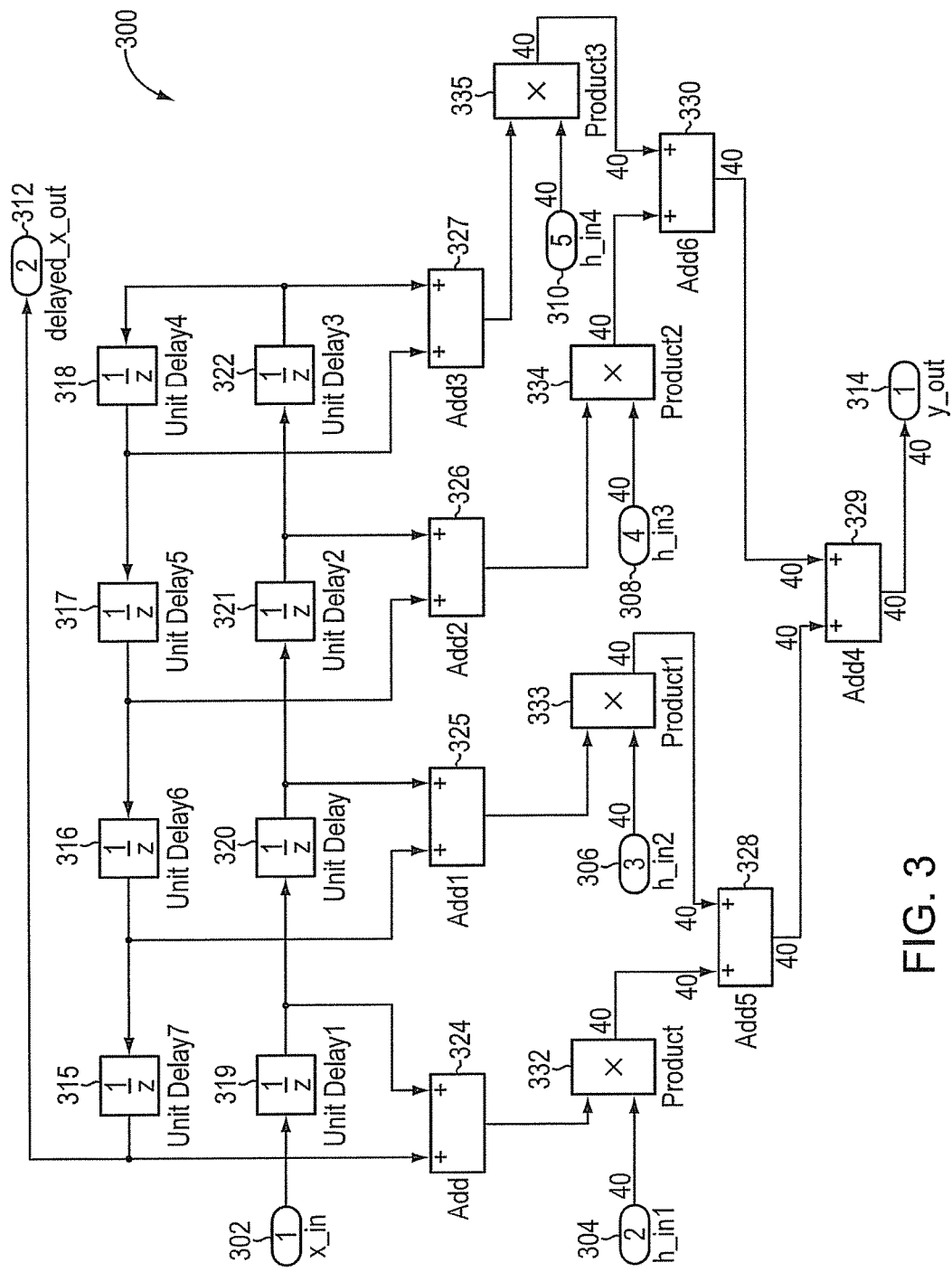
FIG. 3 is an exemplary graphical program for use with the present invention.

FIG. 3 is a schematic illustration of the source graphical model 300. The source graphical model 300, which illustrates a symmetric Finite Impulse Response (FIR) filter that filters forty (40) parallel channels, includes a plurality of blocks interconnected by lines such as arrows. Specifically, the source graphical model 300 has a first input port (Inport) block 302 that receives a scalar element or value, and second, third, fourth, and fifth Inport blocks 304-310, respectively, that each receive a vector of elements or values typically referred to as the filter coefficients. Specifically, the second through fifth Inport blocks 304-310 each receives a 40-element vector. Source model 300 also has a first output port (Outport) block 312 that outputs a scalar value, and a second Outport block 314 that outputs a vector of width forty, i.e., a 40-element vector.

Source model 300 further includes eight Unit Delay blocks 315-322, seven Add blocks 324-330, and four Product blocks 332-335. The Unit Delay blocks 315-322 hold and delay their inputs by a specified sample period or step. If the input to a given Delay block is a vector, the block holds and delays all elements of the vector by the specified sample period or step. The Add blocks 324-330 perform addition on their inputs, which may be scalar, vector, or matrix types. The Product blocks 332-335 perform multiplication on their inputs, which may also be scalar, vector or matrix types. The blocks of the model 300 are interconnected by arrows that establish relationships among the blocks. The relationship represented by the arrow or line may depend on the kind or type of model. For example, in a time-based modeling system, an arrow may represent a mathematical relationship between two connected blocks where a first, e.g., upstream, block updates the signal, and a second, e.g., downstream, block reads the signal. In other modeling environments, the arrows or lines may represent data and/or control flow among the blocks.

A sequence of arrows that link a series of blocks, e.g., from an Inport to an Outport, may be referred to as a path, such as a signal or data path. Different paths through the model 300 may remain parallel to each other, or may merge at a join point of the model, such as a particular block. For example, a first path starting at the Inport 302 merges with a second path starting at the Inport 306 at the Product block 333.

The source graphical model 300 is intended for illustrative purposes only. Other models may be received for processing, such as models having different types or arrangements of blocks or representing different dynamic or other systems.

The source graphical model 300 may execute over one or more steps, where a step refers to an iteration of the model 300. For example, the source graphical model 300 may be a time-based model that executes over a plurality of time steps from a start time to an end time. The time step of the source graphical model may be color coded. For example, portions of the source graphical model having different time steps may be represented in different colors. Alternatively, the source graphical model may be an event-based system, such as a state diagram, that executes over a plurality of event steps. In another embodiment, the source graphical model may be a dataflow model in which case the one or more steps may be time or event based. An exemplary event in a dataflow model may be the availability of new data to be consumed.

For example, the source graphical model 300 may be a time-based model generated by the Simulink® graphical modeling system from The MathWorks, Inc. that executes or runs, e.g., iterates, over one or more time steps.

It should be understood that each block of the source model may execute once every time step. Alternatively, one or more blocks may execute once every occurrence of some multiple of the time step, such as once every third or fourth time step. Furthermore, the time step for a given block may be inferred from one or more other blocks of the model. For example, the time step for a given block may be indicated to be inherited, and an inferencing engine may determine the actual time step. The inferencing engine may be based on propagation, for example, when the output of a block with a time step indicated to be inherited is connected to the input of a block with a time step, the inherited sample time may be inferred to be that given time step. Other execution information such as data type, complexity, and dimensions may also be determined by an inferencing engine.

At each step of the model 300, each Product block 332-335 receives a scalar value and a vector of forty elements or values, and produces a vector of forty elements. To produce a hardware description of the source graphical model 300 that is bit true and cycle accurate, a code generation system may synthesize forty parallel multipliers in hardware for each Product block 332-335. In other words, for the source model 300, which has four Product blocks 332-335, each processing a forty element vector, a code generation system may synthesize a total of 160 hardware multipliers to implement the source model 300 in hardware. Such a large number of multipliers can consume significant physical resources on a target hardware element or device, such as an FPGA, being configured with the hardware description generated from the source model 300.

To determine the exact number of resources consumed by a hardware description of the source graphical model 300, the user may direct the report generator 221 to evaluate the source graphical model 300. The report generator 221 may examine an in-memory representation of the source model 300, which may be produced by the IR generator 214, and determine the number of resources that would be required to implement the source model 300 in hardware. The hardware resource report produced by the report generator 221 may be presented to the user, e.g., on the display 120 of the computer system 100, for evaluation.

As described herein, the streaming optimizer 222 and the resource sharing optimizer 224 of the optimization engine 220 are each configured to enable more optimized hardware description to be generated from the source model 300. In an embodiment, this optimized hardware description remains bit true and cycle accurate to the source model 300 modulo a pre-determined initial latency, but uses less physical hardware resources, e.g., fewer multipliers.

Streaming

Figure 4A:
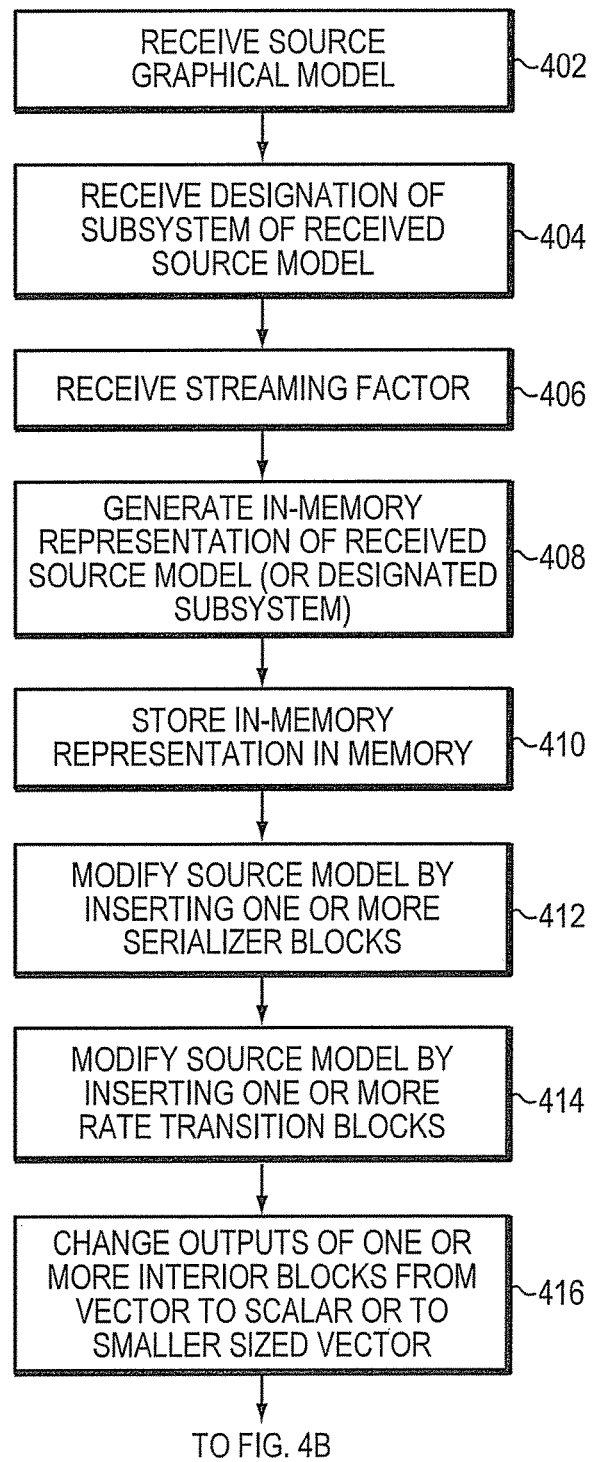
FIGS. 4A-C are partial views of a flow diagram of a method in accordance with an embodiment of the present invention.
Figure 4B:
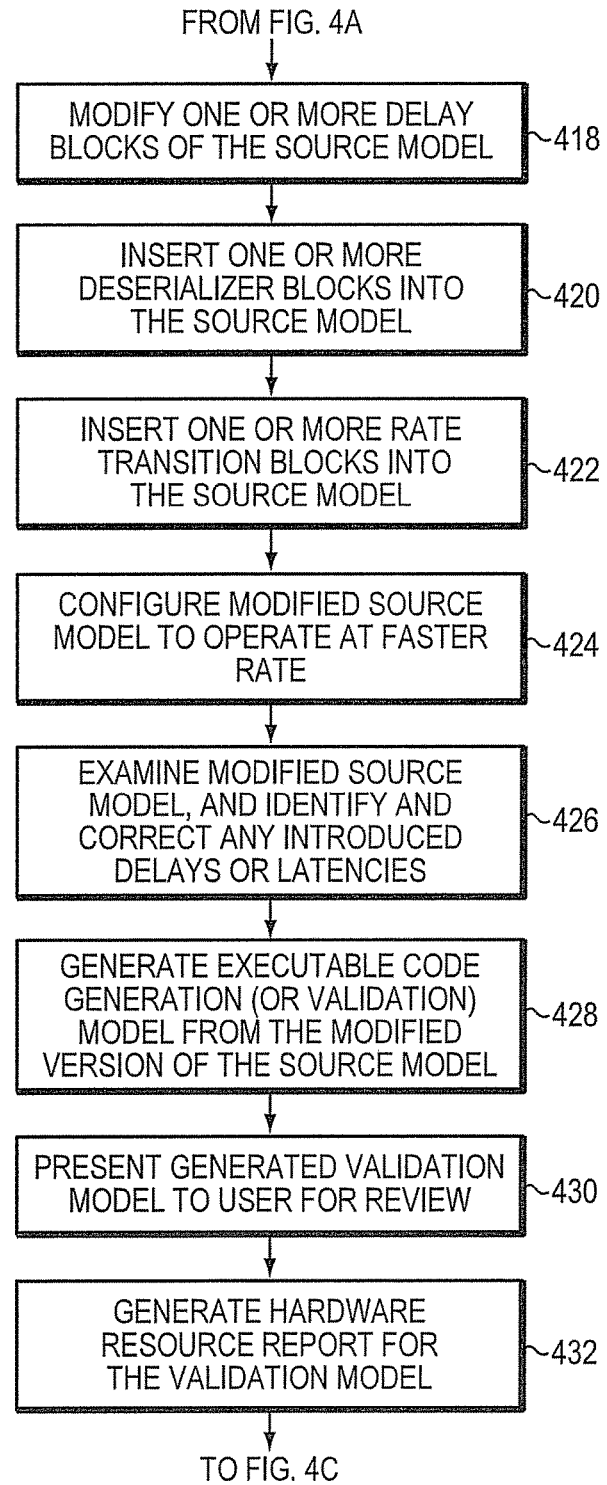
Figure 4C:
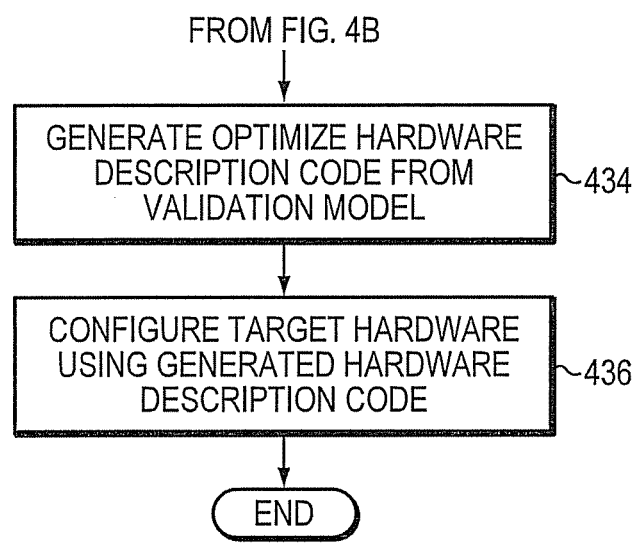

FIGS. 4A-C are partial views of a flow diagram of a method in accordance with an embodiment of the invention. A graphical model, such as the source graphical model 300, is received by the code generation system 200, as indicated at block 402. The code generation system 200 may receive a designation of a particular portion of the model, such as a subsystem, for code generation, as indicated at block 404. In an embodiment, the code generation system 200 may also receive a designation of a streaming factor (Sf), e.g., from the user, as indicated at block 406.

The code generation system 200 and/or the high-level technical computing environment 124 may include a user interface component that generates a user interface, such as a graphical user interface (GUI), for presentation to the user, e.g., on the display 120 of the computer system 100. The GUI may include one or more controls through which the user can select or specify options, such as a subsystem of a model for which code generation is to be performed, and the desired streaming factor (Sf), and through which the user can initiate code generation. The streaming factor may be provided explicitly or it may be implicit given one or more constraints. For example, the user may identify a lower bound on the time step at which blocks execute, and the streaming factor may be inferred from this.

It should be understood that the initiation of the code generation, the designation of the subsystem, and the specification of the streaming factor (Sf) may alternatively or additionally be specified textually through a Command Line Interface (CLI).

It should be understood that, in an embodiment, the code generation system may not receive a streaming factor (Sf). In this case, the code generation system 200 may be configured, for example, to fully scalarize each source model or subsystem being optimized, or the code generation system may determine a streaming factor based on model criteria, such as latency of the computations along a data path.

The front-end processing unit 212 may perform a number of preliminary tasks, such as capturing dataflow relationships specified in the source model 300, if any, determining block semantics, such as the type of block, determining particular block and/or subsystem parameter settings, as established by the user, etc. This information may be provided by the front-end processing unit 212 to the Intermediate Representation (IR) generator 214.

The IR generator 214 may generate an in-memory representation of the source graphical model 300 or the designated subsystem, as indicated at block 408. In an embodiment, the in-memory representation is in a form and structure that is suitable for use in generating hardware description code as well as returning the in-memory representation back into an executable graphical model. In an embodiment, the in-memory representation is in the form of a hierarchical, Data Flow Graph (DFG), referred to as a Parallel Intermediate Representation (PIR), which has a plurality of nodes interconnected by edges. The nodes of the PIR, also known as components, represent blocks from the source model or designated subsystem in an abstract manner, and the edges of the PIR, called signals, represent the connections between the blocks of the model or subsystem. Special nodes, called network instance components (NICs), provide hierarchy in the PIR, for example, by abstractly representing subsystems of the model. That is, each block of the source model 300 or subsystem may map to one or more nodes of the PIR, and each line or arrow of the source model 300 may map to one or more edges of the PIR.

Signals may be continuously defined over a period of time based on values computed at points in time during the period. For example, a signal value may be defined over an interval of time with a start time and a stop time by extrapolating the value of the signal computed at the start time. The extrapolation may be based on a zero-order hold. As another example, a signal value may be defined over an interval of time with a start time and a stop time by interpolating the value of the signal computed at the start time and the stop time. The interpolation may be based on a first-order hold.

In an embodiment, the in-memory representation may have a plurality of hierarchically arranged levels. More specifically, the PIR may be a top-level of the in-memory representation of the source model 300, and one or more of the components of the PIR may be a particular type or form of in-memory representation. For example, one or more components of the PIR may a Control Flow Graph (CFG), Control Data Flow Graph (CDFG), program structure tree (PST), abstract syntax tree (AST), etc. A CDFG may capture the control flow as well as the data flow of a graphical model through data dependency and control dependency edges.

The in-memory representation or IR may be stored in memory, such as main memory 104, as indicated at block 410.

If the PIR represents a model having one or more subsystems, the optimization engine 220 may locate the subsystem, e.g., the NIC within the PIR, that has been marked for hardware description generation.

The streaming optimizer 222 parses the PIR gathering information about the PIR, and performs a number of modifications to the PIR thereby generating a modified PIR. The streaming optimizer 222 may operate on the PIR or the source model. For ease of description, at least some of the operations are described with reference to the source model 300 rather than the PIR. Similarly, while the optimization engine 220 may be configured to operate on a subsystem of a model, the functions performed by the optimization engine 200 are described as operating on the source graphical model 300. It should be understood that the source graphical model 300 may represent a subsystem of a larger model (not shown). This larger model may include the source graphical model 300 by reference and may include more than one instance of the source graphical model 300. The source graphical model may be stored in a shared repository such as, for example, a library, or the source graphical model may be stored separately in an individual repository such as, for example an electronic file. The interface between the larger model and the referenced model may be stored by the larger model. This interface may include, for example, the number of input ports, the number of output ports, the data type of input and output ports, sample time of input and output ports, dimensions of input and output ports, etc. The larger model also may store information of the referenced model, such as the version number of the referenced model.

For each Inport of the source model 300 that is an N-sized vector, the streaming optimizer 222 may insert a new node in the PIR that represents a new block, referred to as a Serializer block, as indicated at block 412. The Serializer block is a dual-rate block that receives the N-sized input vector at the original rate, and outputs or streams that input data at a different size and at a higher rate than the source model 300. The size, e.g., vector width, of the output of the Serializer block as well as its rate is computed by the streaming optimizer 222, for example, as a function of the streaming factor (Sf) specified by the user. Depending on the specified streaming factor (Sf), the output of the Serializer block may be a scalar, or it may be a vector having a smaller size, e.g., smaller width, than the input vector.

The input of a Serializer block may be multi-dimensional, for example, it may have two dimensions. The multi-dimensional input may be a frame. Each of the dimensions may have a size, and the size of the combined data stored may account for all elements in the multi-dimensional input or may be less. For example, in a sparse representation, certain values such as 0 may not be explicitly stored. The output of the Serializer block may be multi-dimensional where the size of each of the dimensions is less than or equal to the respective dimensions of the input or where the size of the combined output data is less than the size of the combined input data.

For example, referring to the second Inport 304 of the source model 300, which receives a 40-element vector, if the user-specified streaming factor (Sf) is 40, then the streaming optimizer 222 configures the Serializer block for the second Inport 304 to output scalar data. On the other hand, if the user-specified streaming factor (Sf) is eight, then the streaming optimizer 222 configures the Serializer block to output a 5-element vector. Accordingly, the output of a given Serializer block may be derived from:

Output=$N/Sf$, where

N is the vector width of the data received at the Serializer block, and

Sf is the user-specified streaming factor.

The result of the division may be rounded to an integer value. If the received data is a frame, then N is the product of all dimension sizes of the frame.

For each Inport of the source model 300 that is a scalar, the streaming optimizer 222 may insert a Rate Transition block into the model 300, as indicated at block 414. A Rate Transition block receives data at a first rate and transmits the data at a second rate that is different than the first rate. A Rate Transition block may be configured to receive data at a fast rate, and output that data at a slower rate. Alternatively, a Rate Transition block may be configured to receive data at a slow rate, and output data at a faster rate. In an embodiment, the output data is computed as a function of the input data.

The Rate Transition block inserted at a scalar Inport of the source model 300 is configured by the streaming optimizer 222 to output its data at a faster rate. The faster rate may be computed by the streaming optimizer 222 as a function of the user-specified streaming factor (Sf). For example, if the streaming factor (Sf) is forty, then the streaming optimizer 222 may configure the Rate Transition block to transmit data at least forty times faster than it is received by the Rate Transition block from the scalar Inport block. If the streaming factor (Sf) is eight, and the vector width in the source model 300 is forty, then the streaming optimizer 222 may configure the Rate Transition block to transmit data from the scalar Inport block five times faster than it is received. In an embodiment, the rate transition block may be configured to transmit data faster than the lower bound as determined by the streaming factor.

After modifying the Inport blocks of the source model 300, the streaming optimizer 222 may analyze the interior blocks of the source model 300, i.e., the function blocks located in between the model's Inports and Outports. For each such interior block of the source model 300, e.g., a target block, if the output of the block is a vector, then the streaming optimizer 222 changes the size of the output, e.g., either to a scalar or to a vector of smaller width, as indicated at block 416. The output size may be computed by the streaming optimizer 222 as a function of the user-specified streaming factor (Sf). For example, as with the model's Inport blocks, if the output of an interior block is a 40-element vector, and the streaming factor is 40, then the streaming optimizer 222 may modify the interior block to output a scalar. If the output is a 40-element vector, but the streaming factor is eight, then the streaming optimizer 222 may modify the block to output a five-element vector.

In an embodiment, the streaming optimizer 222 may be restricted, for example through user configuration, to operate on a part or portion of the source graphical model 300.

The streaming optimizer 222 also may modify any Delay blocks of the source model 300, as indicated at block 418 (FIG. 4B). Specifically, because the streaming optimization procedure interleaves the computation between parallel threads of execution, Delay blocks are expanded by the streaming optimizer 222 to hold data from each thread of computation. More specifically, for each Delay block of the source model 300, where the delay is given by $Z^{-k}$, where k is the number of steps, e.g., time steps or sample periods, of delay implemented by the block, the streaming optimizer 222 may modify the amount of delay being implemented by the Delay block to:

$Z^{-k*Sf}$ where k is the number of steps of delay of the original Delay block, N is the original vector width of the source model, and Sf is the user-specified streaming factor.

For each Outport of the source model 300 that is an N-sized vector, the streaming optimizer 222 may insert a new block into the source model 300, referred to as a Deserializer block, as indicated at block 420. The Deserializer block is a dual rate block that receives input data, which may be a scalar or a vector, and outputs that data at a slower rate than at which it is received, and as a vector or, to the extent the Deserializer block receives a vector, the output is a larger vector. The streaming optimizer 222 configures a given Deserializer block based on the vector width of the respective Outport block. For example, if an Outport block has a vector width of 40, the streaming optimizer may configure the Deserializer block to convert its input data, which is either a scalar or a vector that is less than 40 elements, to a 40-element vector.

The input and output of the Deserializer block may have different dimensions. The size of each of the dimensions of the output may be less than or equal to the size of the respective dimensions of the input. The dimensions of the input and output may be different. For example, the input may be scalars of one dimension with size one and the output may be of two dimensions both with size two. The input or output may be frames.

For each Outport of the source model 300 that is a scalar, the streaming optimizer 222 may insert a Rate Transition block in the source model 300 at the scalar Outport, as indicated at block 422. The Rate Transition block for a scalar Outport is configured by the streaming optimizer 222 to output its data at a slower rate than the rate at which the data is received. For example, if the streaming factor (Sf) is forty, then the streaming optimizer 222 may configure the Rate Transition block to transmit data to the scalar Outport block forty times slower than it is received by the Rate Transition block. If the streaming factor (Sf) is eight, and the vector width in the source model 300 is forty, then the streaming optimizer 222 may configure the Rate Transition block to transmit data to the scalar Outport block five times faster than it is received.

The streaming optimizer 222 also configures the blocks of the source model as modified, except for the model's Inports and Outports, to operate at a faster rate as compared to the original source model 300, as indicated at block 424. The faster rate of modified model may be determined by the streaming optimizer 222 as a function of the user-specified streaming factor (Sf). More specifically, the faster rate may be given by:

$$\text{faster rate}=Sf*\text{original rate}$$

In an embodiment, the source graphical model 300 may be a time-based model that executes once every one or more time steps over a period of time. Each step of the source model 300 may correspond to one clock cycle of the hardware description generated for the source model.

With reference to the source graphical model 300, which processes 40-element wide vector data, suppose the specified streaming factor is 40. In this example, the streaming optimizer 222 may configure the nodes of the PIR to run at a rate that is forty times the rate of the source graphical model 300.

A system master clock may be provided for the generated hardware description code, and this system master clock may be configured to run at a faster rate than the nominal sample rate of the source model 300. A timing controller may receive the system master clock signal, and be configured to provide clock (clk) and clock enable signals to the various components of the hardware description code at the appropriate rates, e.g., using counters and multiple clock enables.

In an embodiment, separate clocks may be provided for each domain operating at a different rate, thereby eliminating the need for timing controllers.

One result of changing the rate of the modified PIR, is the introduction of latencies or delays in one or more data paths through the model 300. If a latency or delay is introduced in a first path in the model 300, and this first path merges with a second path for which no (or a different) delay was introduced, then the signals or data represented by these two paths may no longer be aligned with each other. Such a mismatch or misalignment may result in incorrect results being produced if the modified model was to be executed, or hardware code generated from the modified model was to be run. In an embodiment, the delay balancing engine 226 cooperates with the streaming optimizer 222 to evaluate the PIR as it is being modified, to identify and account for, e.g., correct, such latencies or delays automatically, as indicated at block 426. The delay balancing engine 226 thus ensures that merging paths remain aligned with each other as specified in the source model.

In an embodiment, the delay balancing engine 226 automatically inserts one or more Delay blocks in the source model, and configures the inserted Delay blocks to return the data paths back into time wise alignment. The delay balancing engine 226 may sum the delays introduced along each path of the source model 300 as a result of the optimizations being performed by the streaming optimizer 222. At each join point of the source model 300, i.e., at each point where two paths merge together, the delay balancing engine 226 compares the sum of delays on each path to determine if they are equal. If the sum of delays at not equal at all of the merging paths, then the delay balancing engine 226 inserts a Delay block into the path having less delay than the other paths, and configures the inserted Delay block so that the sum of delays along all of the merging paths is equal at the join point being evaluated. The inserted Delay block also may be configured to operate at the same rate as the other signals at the join point being evaluated. This process is repeated at all of the join points in the model as optimized by the streaming optimizer 222 to ensure that the data remains aligned as specified in the original source model 300.

In an embodiment, the delay balancing engine 226 may consider each edge of the modified PIR. Each edge may correspond to a signal, data or control path of the modified model. An edge being evaluated extends between a source or driver block and a destination or receiver block. The delay balancing engine 226 may evaluate the other edges that join at the same receiver block as the subject edge, and determine the value of the maximum or highest latency at these other edges. In addition, the delay balancing engine 226 may determine the delay, if any, introduced by the source block for the subject edge. The delay balancing engine 226 may compute the difference between the determined maximum latency and the latency introduced at the subject edge's source block. If the computed difference is greater than zero, the delay balancing engine 226 may insert a Delay block into the subject edge, i.e., between the source and destination blocks. The delay balancing engine 226 also may configure the inserted Delay block so that it provides a delay that aligns the latencies introduced at the destination block, for example, by choosing a delay that is equal to the computed difference.

In an embodiment, the delay balancing engine 226 is also configured to consider the rate at which delays are introduced along the edges of the modified PIR. For example, suppose a single delay at a rate of 5 is introduced on a first edge, and a single delay of rate 10 is introduced on a second edge. While the number of delays along these two edges is equal, i.e., they are both 1, the delays are not aligned because of a rate mismatch. The delay balancing engine 226 may normalize the rates of delays before comparing them. The single delay at rate 5 may be translated to a delay of 2 units at rate 10. Upon normalizing the rates, a mismatch is now identified by the delay balancing engine 226. In this case, the delay balancing engine 226 may add a single delay at rate 10 to the second edge.

In addition to considering the model's join points, the delay balancing engine 226 may also identify and evaluate each of the rate transition boundaries of the source model as modified, because the rate transition may itself be a source of data misalignment. Exemplary rate transition boundaries include Downsample and Upsample blocks, or other blocks operating at multiple rates. For a Downsample block having a downsample factor of K (the output is K times slower than the input), the delay balancing engine 226 may insert a delay at the input of the Downsample block with a rate matching the faster input rate of the Downsample block, and configured with a delay given by:

$$\text{Input\_Delay}=K-(N \% K), \text{ where}$$

N represents the number of new delays introduced along the path ending in the input to the downsampling block, % is the modulo operation, and K may be given by the output rate divided by input rate.

In addition, the delay balancing engine 226 may compute the total delay at the output of the Downsample block, which value may be used in subsequent evaluations of the source model as modified, as follows:

Downsample_Output_Delay=ceil(*N/K*) where ceil is a function that rounds the input (N/K) to the nearest integer greater than (N/K). This new output_delay is operating at the slower, output rate of the Downsample block.

For an Upsample block, where the rate goes from slower to faster, the delay balancing engine 226 may not insert a Delay block. The delay balancing engine 226 may compute the total delay at the output of an Upsample block having an upsample factor of K, again for use in subsequent evaluations of the model as modified, as follows:

Upsample_Output_Delay=(input delay at the Upsample block)**K*

This computed delay is operating at the faster, output rate of the Upsample block.

In an embodiment, the functionality performed by the delay balancing engine 226 may be selectively disabled and enabled, e.g., by the user, as desired. The functionality may be disabled or enabled by setting a property, such as a BalanceDelays property of the code generation process, to 'on' or 'off'. If the delay balancing engine 226 is disabled, then the user may need to manually account for the introduction of any delays into the source model.

As described, the streaming optimizer 222 and delay balancing engine 226 may change the original PIR that was created from the source graphical model 300. For example, new blocks, such as Serializer, Deserializer, Rate Transition and Delay blocks, may have been added, and the rate of at least a portion of the source model 300 may have been changed. This modified version of the original PIR may be referred to as a code generation PIR, and optimized hardware description code may be generated from the code generation PIR. In an embodiment, a technique is provided that verifies that this modified, i.e., code generation, PIR still produces the same results as the original PIR, which was generated from the source graphical model 300. Specifically, the graphical model generator 216 may receive the code generation PIR, and generate an executable code generation graphical model, which may also be referred to as a validation model, from the code generation PIR, as indicated at block 428. That is, the graphical model generator 216 may create a validation graphical model that includes blocks for the nodes or components that were added to the original PIR. In addition, the graphical model generator 216 may interconnect these blocks based on the edges of the modified, i.e., code generation, PIR, for example, by adding lines or labeling input and output. The validation model produced by the graphical model generator 216 may be presented to the user for evaluation, e.g., on display 120, as indicated at block 430.

In an embodiment, the validation process, including the generation of the validation model from the code generation PIR, may be disabled or enabled by, e.g., the user. For example, a user may set a property, such as a GenerateValidationModel property, of the code generation process either 'on' or 'off'.

Figure 5B:
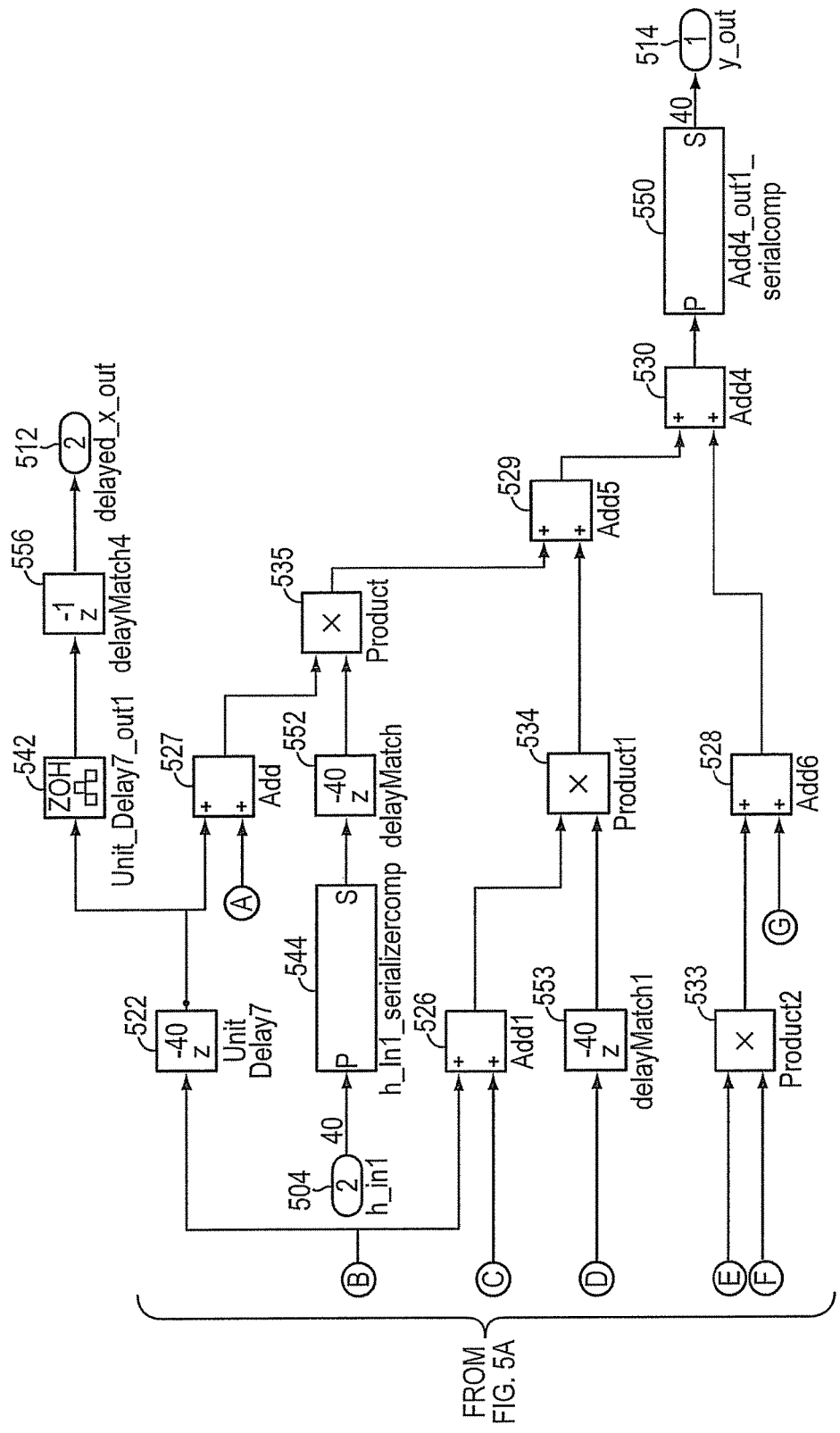

FIGS. 5A and 5B are partial views of a schematic illustration of a graphical code generation or validation model 500 generated by the graphical model generator 216 from the code generation PIR, and presented to the user, e.g., on the display 120. FIG. 5 is a smaller scale view indicating the positions of FIGS. 5A and 5B to form a whole view. Like the source graphical model 300, the validation model 500 also has a scalar Inport block 502, four vector Inport blocks 504-510, a scalar Outport block 512, and a vector Outport block 514. Validation model 500 also includes eight Delay blocks 515-522, although instead of Unit Delays as in the source model 300, the Delay blocks 515-522 of the validation model 500 are Integer Delay blocks. In an embodiment, initial conditions of the Integer Delay blocks 515-522 may be as a function of the initial conditions of the Unit Delay blocks 315-322, for example, they may be the same values. Validation model 500 also includes seven Add blocks 524-530, and four Product blocks 532-535. Validation model 500 also includes several other blocks as a result of the optimizations performed by the streaming optimizer 222, as described above in connection with FIGS. 4A-C. Specifically, a first Rate Transition block 540 is coupled to the scalar Inport block 502. A second Rate Transition block 542 is coupled to the scalar Outport block 512. Additionally, a separate Serializer block 544-547 is coupled to each of the vector Inport blocks 504-510. A Deserializer block 550 is coupled to the vector Outport block 514.

It should be understood that the addition of the Rate Transition block 540, and the Deserializer block 550, introduces new delays into the validation model 500. To account for these delays, the delay balancing engine 226 may cause new blocks to be inserted into the validation model 500, as described above in connection with block 426. For example, the delay balancing engine 226 may insert five new Delay blocks 552-556 into the validation model 500.

Without the new Delays blocks 552-556, which may be referred to as Delay Matching blocks, the delays might cause the validation model 500 to produce incorrect results, as compared to the source graphical model 300.

As shown by FIGS. 5A and 5B, each Product block 532-535 of the validation model 500 receives two scalars, as compared to the Product blocks 532-535 of the source graphical model 300 that each receive a scalar and a forty element vector. Accordingly, in order to generate a bit true and cycle accurate hardware description for the validation model 500, only four multipliers need to be synthesized in the physical hardware, as compared to the 160 multipliers that were required for the source graphical model 300. This substantial reduction in the number of multipliers saves significant resources on the physical hardware.

In an embodiment, the validation model 500 may illustrate the rate of execution of the various portions of the model 500, such as by color coding, different line styles, e.g., solids, dashes, dash-dots, etc. For example, the portion of the model operating at the fastest rate may be shown in red, while the portion of the model operating at the slowest rate may be shown in green. In another embodiment, portions of the model operating in a first clock domain may be depicted differently than a second portion of the model operating in another clock domain, e.g., by color coding, line style coding, etc.

The report generator 221 may be directed to produce a report that describes or lists the resources that would be required to implement the validation model 500 in hardware, as indicated at block 432. For example, a user-settable parameter may be asserted, e.g., set to 'on', that causes the report generator 221 to generate a hardware resource report upon creation of the modified PIR and/or validation model 500. Alternatively, the user may operate the GUI to direct the report generator 221 to create the report. The hardware resource report may be presented to the user, e.g., on the display 120. It may also be saved in memory and/or printed.

By applying the streaming optimization process to a source model, such as source model 300, a user can conserve resources of a target physical hardware element, such as the I/O pins of a physical hardware element as well as Look-up Tables (LUTs), Arithmetic Logic Units (ALUs), DSP48s, and other device internal resources.

Figure 6A:
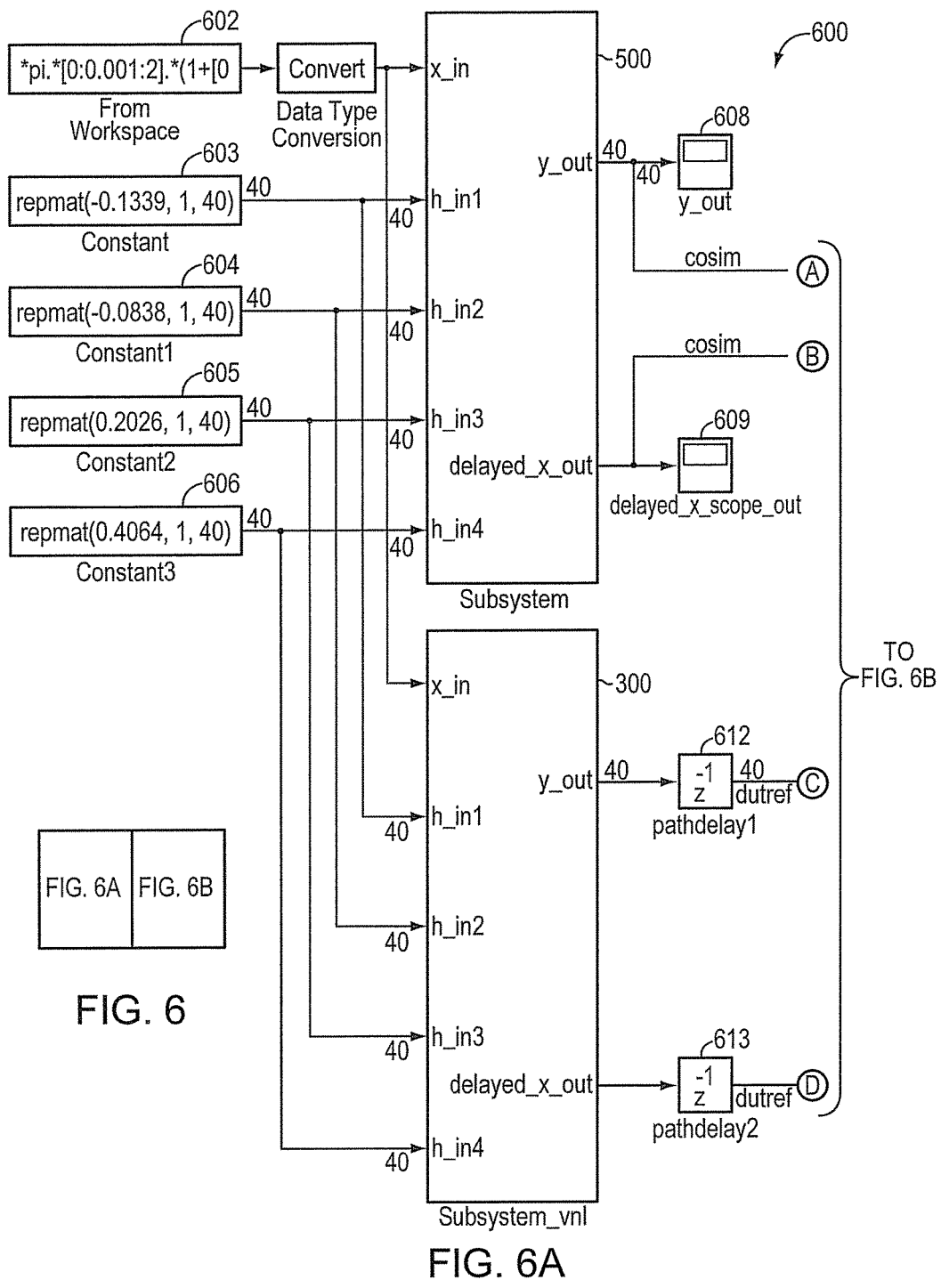
FIGS. 6A and 6B are partial views of a schematic illustration of a validation environment in accordance with an embodiment of the present invention.
Figure 6B:
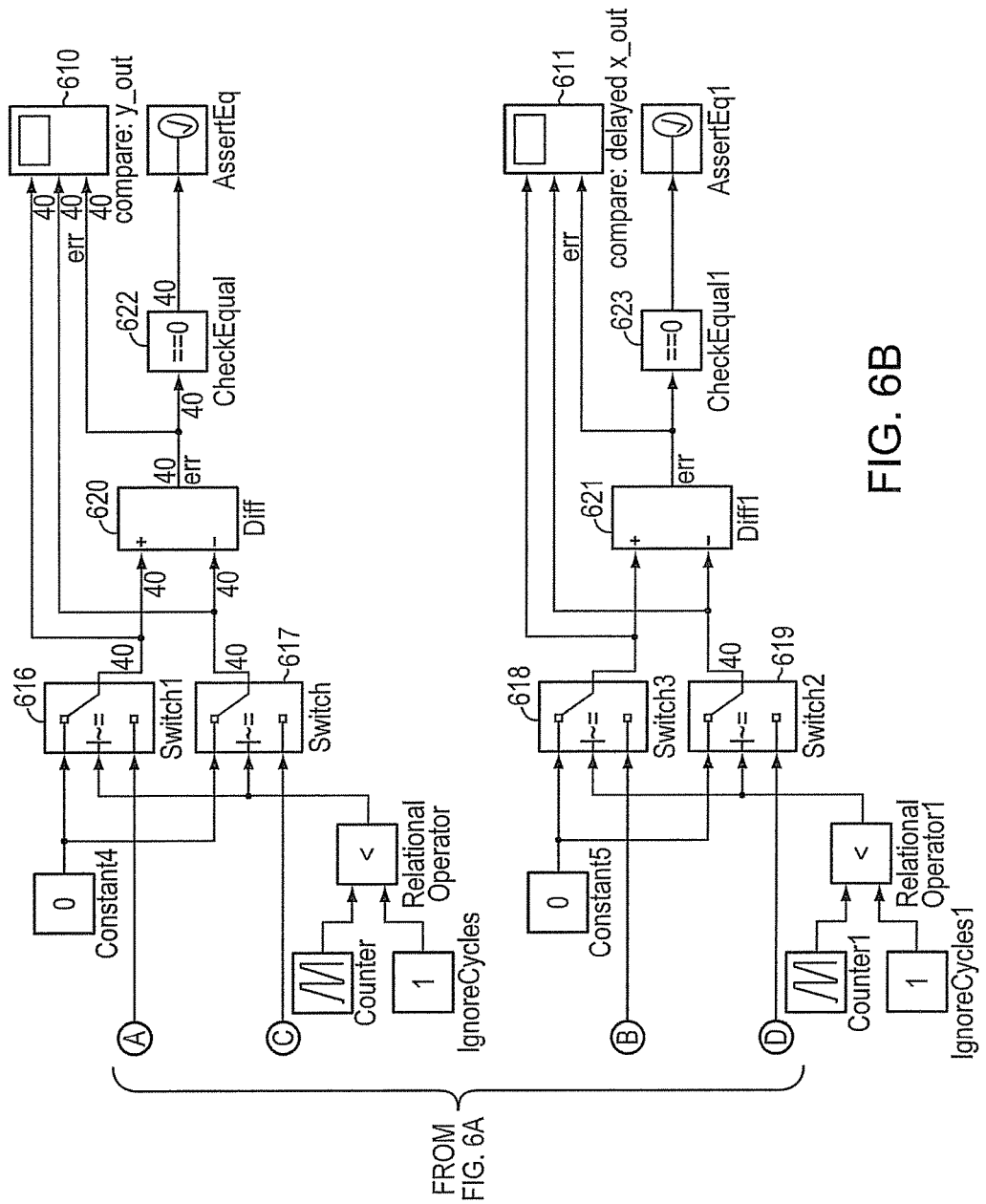

In an embodiment, the validation model 500 may be received by the validation engine 230, which may be configured to produce a validation environment that allows the source graphical model 300 to be compared directly to the validation model 500. FIGS. 6A and 6B are partial views of a schematic illustration of a validation environment 600 that may be produced by the validation engine 230 in cooperation with the high-level technical computing environment 124, and presented to the user, e.g., on the display 120. FIG. 6 is a smaller scale view indicating the positions of FIGS. 6A and 6B to form a whole view. The validation environment 600 includes both the source graphical model 300 and the validation model 500 both of which may be abstracted as subsystems.

The validation environment 600 may include one or more source blocks, such as source blocks 602-606 that may be coupled to both the original source model 300 and the validation model 500. Outputs of the source and validation models 300, 500 may be coupled to one or more scope or plotting blocks, such as scope blocks 608-611. As shown, a delay block, such as delay blocks 612 and 613, may be inserted to the outputs of the source model 300 in order to align time-wise the outputs of the source model 300 with the outputs of the validation model 500, which as described above are cycle accurate with the source model modulo a predetermined latency. Alternatively, the delay blocks may be inserted to the input of the source model 300, which initializes the validation model 500 before starting the comparison. The validation environment 600 may configure the delay blocks 612, 613 with this predetermined latency. Interposed between the outputs of the models 300, 500 and the scope blocks 610, 611 may be one or more switch blocks, such as switch blocks 616-619, one or more differencing blocks, such as differencing blocks 620, 621, and one or more Check Equal blocks, such as Check Equal blocks 622, 623.

The user may cause the validation environment 600 to be run. That is, the simulation or execution engine of the technical computing environment 124 may run, e.g., execute, environment 600. It should be understood that environment 600 may also be run programmatically.

By running the validation environment, the scope blocks 610, 611 may present, e.g., on display 120, the output computed by the source model 300, the output computed by the validation model 500, and the difference between those two outputs, for each corresponding output of the source and validation models 300, 500.

The first valid output of the validation model 500 is produced only after the end of the initial, pre-determined latency. Until that time, all outputs of the validation model should be ignored. The Counter, Ignore_Cycles, Relational_Operator, and Switch blocks achieve this effect programmatically. More specifically, the Counter may be used to keep time. The Ignore_Cycles may be used to provide a constant that is equal to the initial latency. The Relational_Operator may return true when 'time'<Ignore_Cycles. While the Relational_Operator returns true, the switch block chooses '0' so that no output comparison is made. As a result, during the first N cycles (equal to the initial, pre-determined latency) no output from the two models is compared. After the first N cycles, the switch block picks the outputs generated from the two models, and these outputs are compared for equivalence.

Other blocks or programming constructs may be used.

Figure 11:
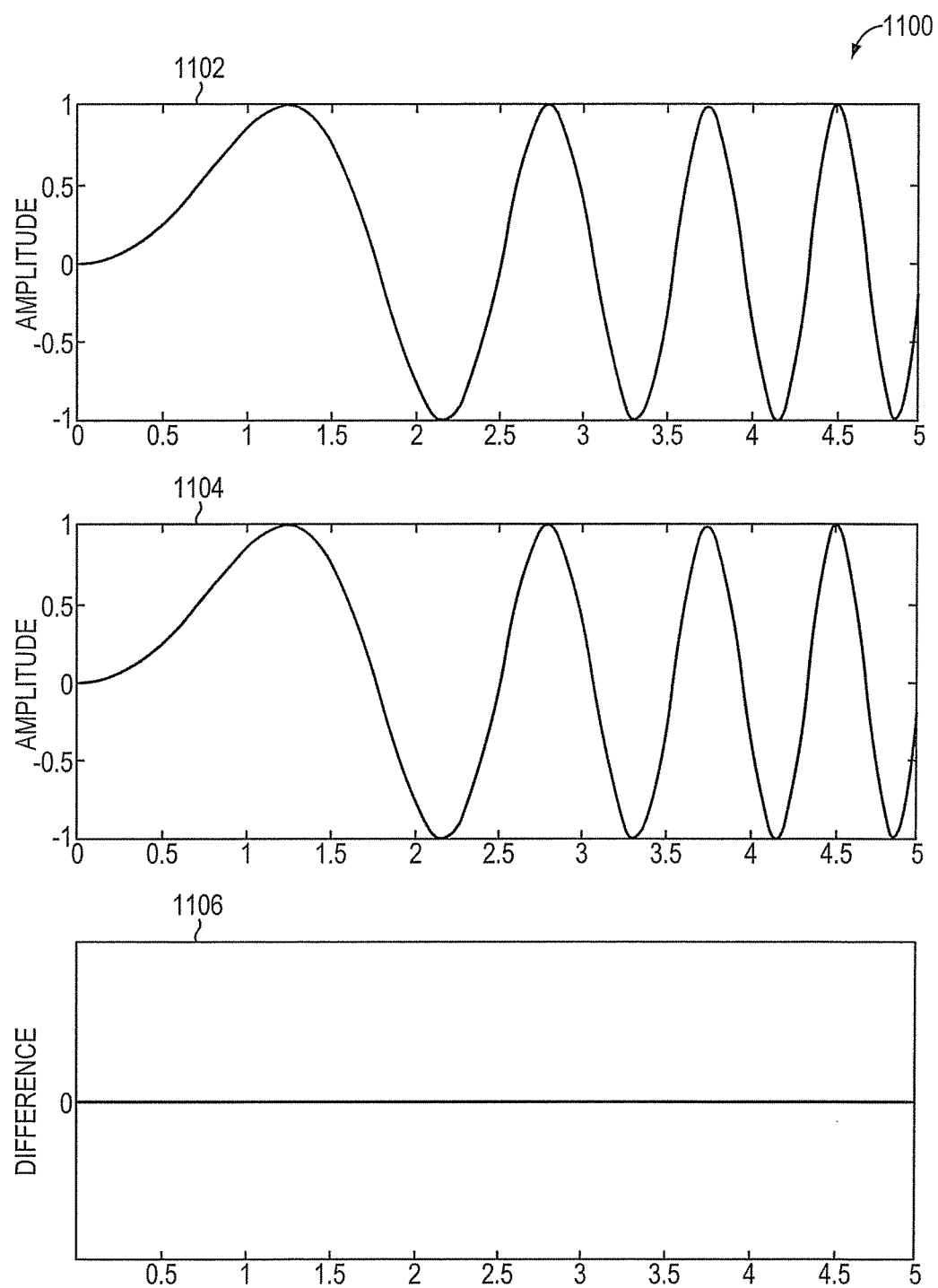
FIG. 11 is a schematic illustration of output plots generated by the validation environment.

FIG. 11 is a schematic illustration of the output 1100 generated by scope block 611. The output 1100 includes a first plot or waveform 1102 that represents the output values computed by the validation model 500, a second plot or waveform 1104 that represents the output values computed by the source model 300, and a third plot or waveform 1106 that represents the differences between the outputs computed by the two models 300, 500. As illustrated, the difference between the outputs computed by the two models 300, 500 is zero for the entire sample time, thereby demonstrating to the user that validation model 500 is indeed bit true and cycle accurate to the source model 300 modulo the predetermined latency.

As discussed above, one of the outcomes resulting from the optimizations performed on the source model 300 include the introduction of one or more delays in the validation (or code generation) model 500 relative to the source model 300. The validation engine 230 may be configured to insert a Delay block at one or more of the outputs of the source model 300 as represented in the validation environment 600 in order to align the outputs of the source model 300 to the validation model 500. More specifically, the delay balancing engine 226 may be configured to compute the cumulative delay along a path through the validation model 500 that terminates at an Outport. The validation engine 230 in cooperation with the delay balancing engine 226 may insert a Delay block configured with this computed cumulative delay at the corresponding Outport of the source model 300 so that the results computed by the source model are brought into time-wise alignment with the results computed by the validation model 500. Any other configuration of these Delay blocks, such as the rate of operation, also may be determined by the delay balancing engine 226. Furthermore, the original inputs to the source graphical model may be routed to the validation model 500 as well. A first Scope block 602 may be coupled to an output port of the source model 300, as delayed by the addition of a respective and a second Scope block 604 may be coupled to the respective output port of the validation model 500. In addition, one or more respective outputs of both the source and validation models 300, 500 may be coupled to a comparator block, such as a Subtract block 606. The output of the Subtract block, moreover, may be coupled to a third Scope block 608.

In an embodiment, when the validation environment 600 is run by the validation engine 230, the signals displayed by the first and second Scope blocks 604, 604, which represent the results computed by the source model 300 and the validation model 500, respectively, should be the same. In addition, the signal displayed in the third Scope 608, which receives the output of the Subtract block 606, should be zero at all steps, e.g., from the start time to the end time. The validation environment 600 provides a visual check to the user that the validation model 500, although different from the source model 300, still produces the same results as the source model 300.

In another embodiment, the validation environment 600 with the source model 300 and the validation model 500 may not be created. Instead, the models 300, 500 may be executed with the same input and their output is stored. This execution may be concurrent. The output of the executions of the two models 300, 500 may then be compared. The source model 300 and validation model 500 may be executed only when, for example, changes to the input, the source model 300 or the validation model 500 are made. For example, the source model 300 may be executed for a given input once and the output of the execution may be stored. This output may be compared with the output of more than one execution of the validation model 500.

In a further embodiment, the source model and the validation model may be compared to validate specific different results. For example, a shift of the data by a certain number of cycles may be validated, a warp in cycle behavior may be validated, such as the validation model executing a factor two slower, etc.

Returning to FIGS. 4A-C, if the user is satisfied with the operation of the validation model 500, and with the resource savings achieved by the streaming optimizer 222, the modified PIR may be used to generate optimized hardware description code, as indicated at block 434 (FIG. 4C). More specifically, the back-end processing unit 218 may interface with the IR generator 214 to generate optimized hardware description code from the modified PIR. This optimized hardware description code may be converted into a serial bit stream for synthesizing target hardware, such as an FPGA, ASIC, CPLD, or other target programmable logic device, as indicated at block 436.

Suitable simulation, synthesis, and layout tools include the ModelSim simulation and debug environment from Mentor Graphics Corp of Wilsonville, Oreg., and the Synplify family of synthesis tools from Synplicity, Inc. of Sunnyvale, Calif.

It should be understood that, with the present invention, the user may easily explore numerous optimization alternatives. For example, the user may repeat the process using a different streaming factor. For example, instead of a streaming factor of 40, which results in a fully scalarized version of the source graphical model 300, the user may specify a different streaming factor, such as eight. In an embodiment, the streaming factor is preferably a factor of the vector width in the model being processed.

In an embodiment, the streaming factor may be automatically chosen, for example to implement an optimization algorithm. For example, the code generation target may have a maximum clock rate. If the streaming factor that is chosen is too high, the target may not be able to implement the required clock rate of the serialized operations. An optimization algorithm may automatically choose a lower streaming factor so that the target can implement the clock rate of the serialized operations. In the case where multiple serialization operations are inserted, the combination of streaming factors may be automatically determined by an optimization algorithm. For example, a greedy search algorithm may be employed.

It should also be understood that the order of steps shown in FIGS. 4A-C may be changed. It should also be understood that one or more steps may be removed or added.

As described herein, the streaming optimizer 222 of the optimization engine 220 is configured to enable more optimized hardware description to be generated from the source model 300. This optimized hardware description remains bit true and cycle accurate to the model 300 modulo a predetermined initial latency, but uses a different hardware configuration, such as less physical hardware resources, e.g., fewer multipliers.

An application of the streaming optimizer 222 may be to reduce the number of Input/Output (I/O) pins of a target hardware device being utilized by a source model. That is, I/O pins are typically a fixed and limited resource of a target hardware device. By converting an input or output vector data path to a scalar data path (or to a smaller width vector path) the streaming optimizer 222 may generate a code generation model that reduces the number of I/O pins that are needed.

Resource Sharing

In addition to conserving hardware resources by converting a vector data path to a scalar (or smaller sized vector) path, the optimization engine 220 may perform another optimization automatically on an in-memory representation of the source model 300, such as the PIR. More specifically, the resource sharing optimizer 224 may search the PIR, identify multiple components that are functionally equivalent to each other, such as components corresponding to blocks or subsystems, and modify the PIR to share a single instantiation of this component. In this way, components that perform equivalent functions may be eliminated, thereby conserving hardware resources.

FIGS. 7A-E are partial views of a flow diagram of a method in accordance with an embodiment of the present invention. A graphical model, such as the source graphical model 300, is received by the code generation system 200, as indicated at block 702. The code generation system 200 also may receive a designation of a subsystem of the received model for code generation, as indicated at block 704. In addition, the code generation system 200 may receive a designation of a sharing factor, e.g., from the user, as indicated at block 706.

A user may specify a desired shared factor through a GUI or CLI, as discussed above in connection with the streaming factor (Sf).

The Intermediate Representation (IR) generator 214 may generate an in-memory representation of the entire source graphical model, e.g., source model 300, or at least the subsystem, as indicated at block 708. In an embodiment, the resource sharing optimizer 224 may analyze and perform its operations on the PIR modified by the streaming optimizer 222. The resource sharing optimizer 224 may perform its optimizations first, followed by the streaming optimizer 222, or the two optimizers 222 and 224 may work simultaneously or substantially simultaneously.

The resource sharing optimizer 224 may search the in-memory representation, e.g., the PIR, to find functional components, which may represent or correspond to blocks and/or subsystems of the source model, that are functionally equivalent with each other, as indicated at block 710. The resource sharing optimizer 224 may operate on the source model or on an in-memory representation of a source model or subsystem. For convenience, reference is made herein to the source model or subsystem. Two blocks of the source model 300 may be considered functionally equivalent by the resource sharing optimizer 224 if the following conditions are met:

(1) the two blocks being compared are both the same type (or kind) of component, e.g., they are both Product blocks, or Gain blocks, etc., (2) the values of the block parameters (if any) for the two blocks being compared are the same, and (3) the inputs and outputs of the two blocks being compared are identical in number, data type and signal rate.

Two subsystems of a source model may be considered to be equivalent, if the following conditions are met:

(1) all of the blocks of each subsystem are treated as a single execution unit by the model execution engine, i.e., the two subsystems are atomic, and (2) a checksum calculation performed on each subsystem yields the same result.

A suitable technique for computing checksums for subsystems of a graphical model is described in U.S. Pat. No.

7,178,112, issued Feb. 13, 2007 for Management of Functions for Block Diagrams, which is hereby incorporated by reference in its entirety.

In an embodiment, Gain blocks having different gain values (i.e., different block parameters) may still be shared. In particular, the Gain blocks of the source model may be replaced with a combination of Constant and Multiplier blocks where the Constant is set to the Gain block's gain parameter. If the resource sharing optimizer 224 determines that the Constant blocks are the same, then the pairs of Constant and Multiplier blocks may be collapsed back into Gain blocks and shared. If the Constant blocks are not the same, then the resource sharing optimizer 224 may share the Multiplier blocks.

The process by which a resource, such as a single instance of a block, is shared may depend on whether there is a data dependency among the candidate blocks. Accordingly, in an embodiment, a determination may be made whether the blocks (or subsystems) identified as candidates for sharing are (1) mutually parallel, or (2) data-dependent, as indicated by decision block 712. Two candidate blocks may be considered data dependent if a data path extends from one to the other. If no such data path exists, the two candidate blocks may be considered mutually parallel.

Figure 7A:
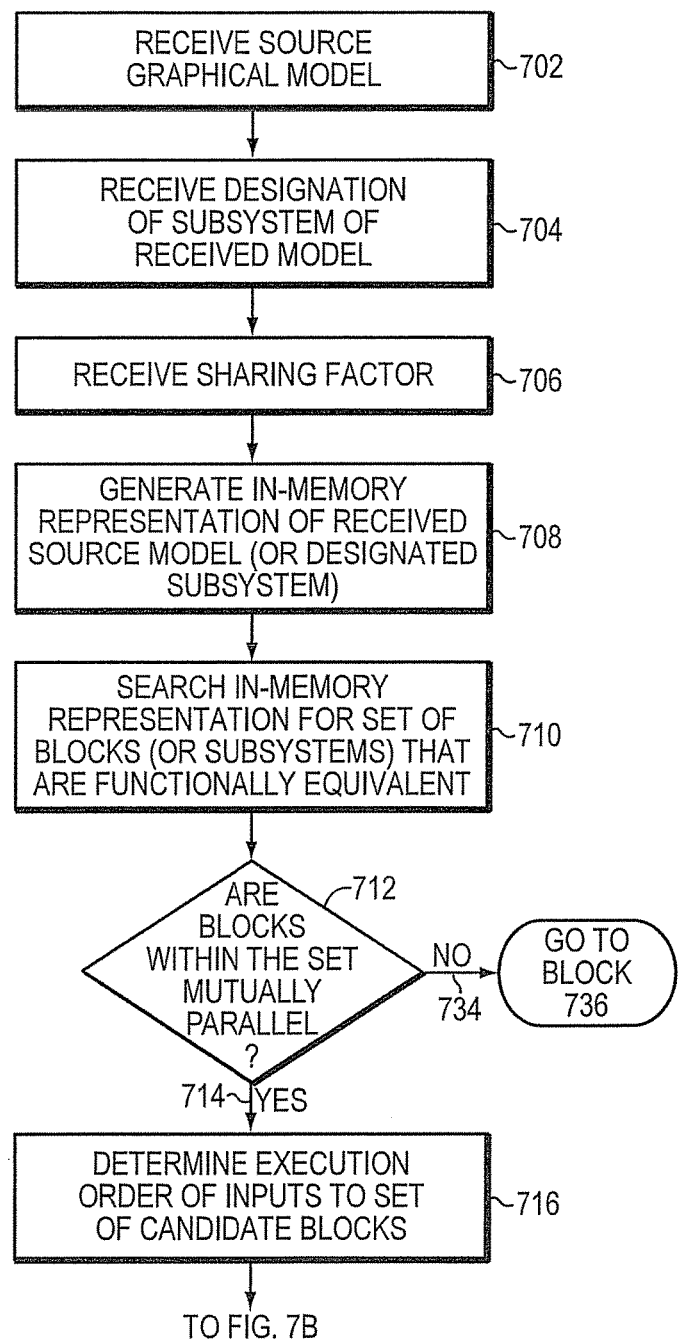
FIGS. 7A-E are partial views of a flow diagram of a method in accordance with an embodiment of the present invention.
Figure 7B:
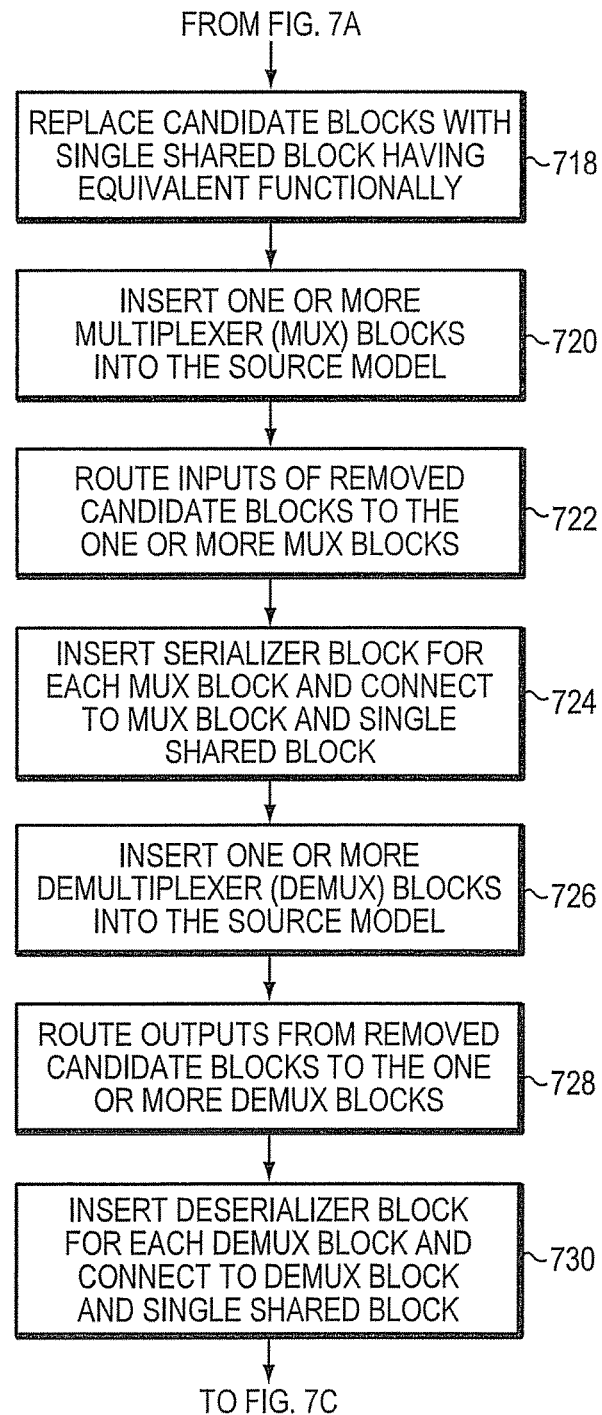

If the candidate blocks are mutually parallel, the resource sharing engine 224 may determine the order of execution of the inputs to the set of candidate blocks, as originally arranged in the source model, that are to be replaced with a single shared instance of the block, as indicated by Yes arrow 714 leading to block 716. The resource sharing engine 224 may determine the execution order of the block inputs by performing a breadth first traversal of the source model. The determined execution order may be stored in a list, such as an ordered list. The resource sharing engine 224 may delete the candidate blocks identified as functionally equivalent, and insert a single shared block with the shared functionality in their place, as indicated at block 718 (FIG. 7B).

Alternatively, the resource sharing engine 224 may select one of the candidate blocks that is to be retained within the model, as modified, and delete the other candidate blocks. For example, the first block in a candidate block ordered list may be selected.

Next, the resource sharing engine 224 may further modify the source model by inserting one or more, e.g., K, Multiplexer (Mux) blocks into the model, as indicated at block 720, where K equals the number of inputs of the single shared block. Each Mux block inserted into the source model may have a plurality, e.g., N, inputs and one output, where N is the number of candidate blocks that were selected for sharing. The one or more Mux blocks are inserted on the input side of the single shared block. The resource sharing engine 224 then routes the inputs of the candidate blocks that were removed from the model to the inputs of the K Mux blocks that were inserted into the source model, as indicated at block 722. The inputs of the removed blocks are routed to the one or more Mux blocks based on the previously determined execution order of the inputs. In general, the $i^{th}$ input of the $x^{th}$ candidate block is routed to the $x^{th}$ input of the $i^{th}$ Mux block. For example, the second input of the first candidate block is routed to the first input of the second Mux block. Similarly, the first input of the third candidate block is routed to the third input of the first Mux block, and so on.

Next, the resource sharing engine 224 may insert a Serializer block between each Mux block and the single shared block, as indicated at block 724. Furthermore, the vector output of each Mux block may be routed to the Serializer block inserted for that Mux block, and the output of the Serializer may be routed to one of the inputs of the single shared block. In addition, the resource sharing engine 224 may insert one or more, e.g., L, Demultiplexer (Demux) blocks each having one input and a plurality, e.g., M, outputs into the source model being modified, where L equals the number of outputs of the single shared resource, and M is the number of candidate blocks that was selected for sharing, as indicated at block 726. The one or more Demux blocks may be inserted on the output side of the single shared resource. The outputs from the deleted candidate blocks may be routed to the outputs of the one or more, e.g., L, Demux blocks, as indicated at block 728. The outputs may be routed in the same manner as described above in connection with the inputs to the Mux block. That is the $i^{th}$ output of the $x^{th}$ candidate block may be connected to the $x^{th}$ output of the $i^{th}$ Demux block.

The resource sharing optimizer 224 may insert a Deserializer block into the source model being modified between each Demux block that was added, and the single shared block, as indicated at block 730. Furthermore, the output of the single shared block may be routed to the input of its respective Deserializer block, and the output of the Deserializer block may be routed to its respective Demux block, as indicated at block 732 (FIG. 7C).

Figure 7C:
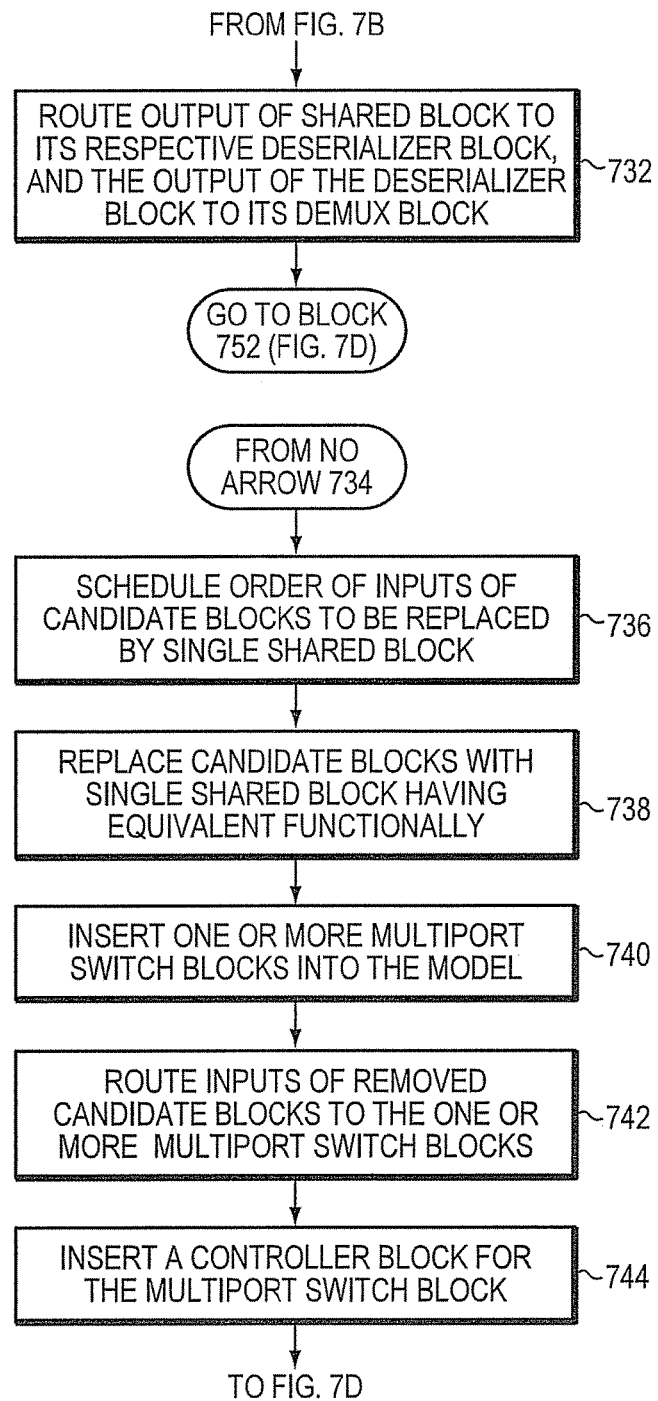

Now, returning to decision block 712, if a data dependency exists among the candidate blocks, then the resource sharing optimizer 224 may schedule the order of the one or more inputs of each candidate block that are to be shared by a single shared block, based on the execution step of the source model at which the respective input is processed, as indicated by No arrow 734 (FIG. 7A) leading to block 736 (FIG. 7C). The resource sharing engine 224 may delete the data-dependent candidate blocks, and insert a single shared block with the shared functionality in their place, as indicated at block 738.

One or more, e.g., G, Multiport Switch blocks may be inserted into the model, as indicated at block 740, where G equals the number of inputs of the single shared block. Each Multiport Switch block inserted into the source model may have a plurality, e.g., J, inputs, a control input, and one output, where J is the number of candidate blocks that were selected for sharing. The signal received on the control input controls which input of the Multiport Switch block is routed to its output. For example, if the received control input is '3', the third input may be switched to the output. The one or more Multiport Switch blocks may be inserted on the input side of the single shared block. The inputs of the candidate blocks that were removed are routed to the inputs of the one or more Multiport Switch blocks that were inserted, as indicated at block 742. As described above in connection with the mutually parallel blocks, the inputs of the removed blocks are routed to the one or more Multiport Switch blocks based on the previously determined execution order of the inputs. Again, the $i^{th}$ input of the $x^{th}$ candidate block may be routed to the $x^{th}$ input of the $i^{th}$ Mux block. A Controller block is inserted into the model and operatively coupled to each of the one or more Multiport Switch blocks that was added, as indicated at block 744. The resource sharing optimizer 224 may configure the Controller block to control the outputs of the Multiport Switch blocks based on the determined execution step order of the removed blocks.

Figure 7D:
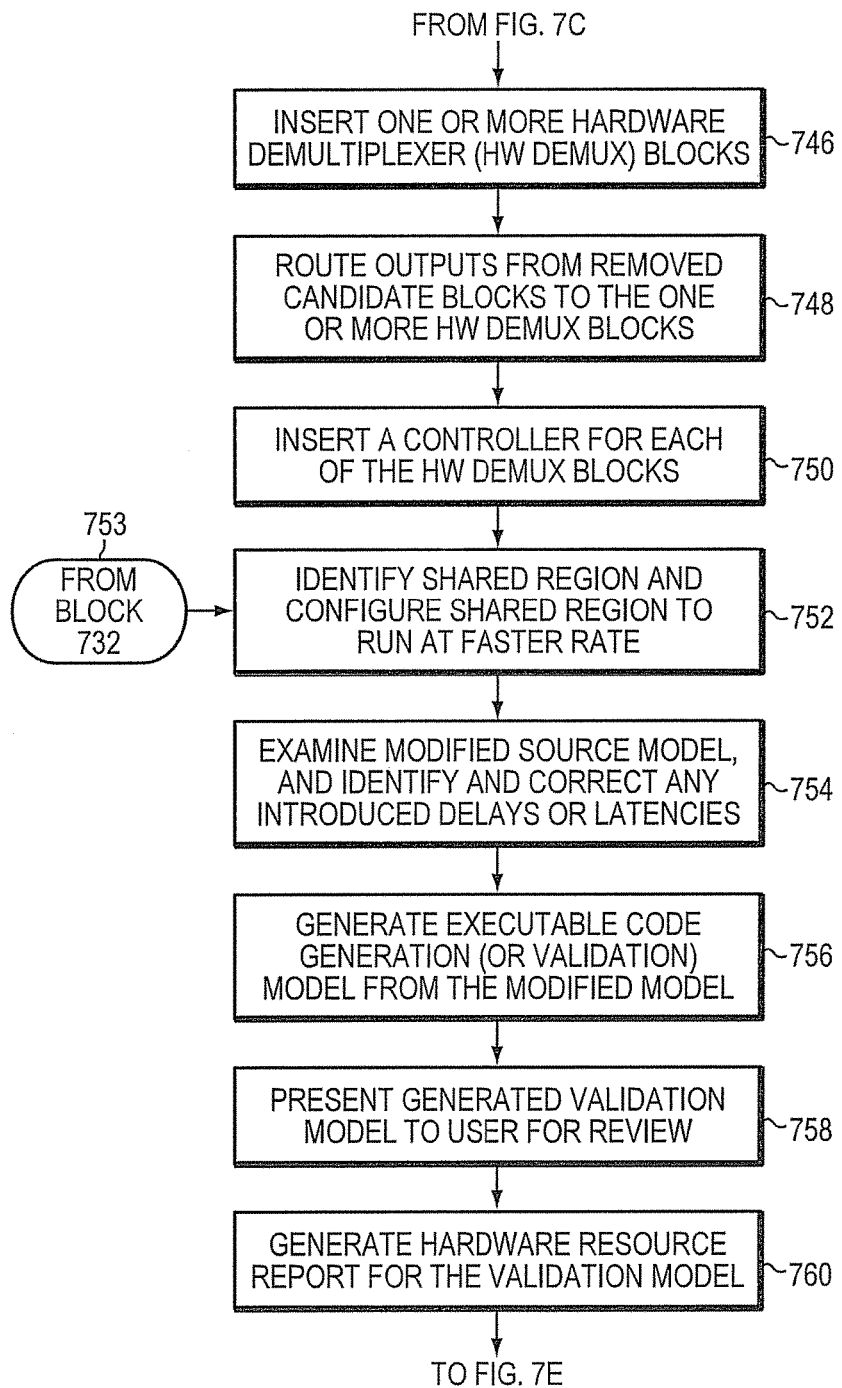

Next, the resource sharing engine 224 may insert one or more, e.g., H, Hardware Demultiplexer (HW Demux) blocks each having one input, a control input, and a plurality, e.g., I, outputs into the source model being modified, where H equals the number of outputs of the single shared resource, and I is the number of candidate blocks that was selected for sharing, as indicated at block 746 (FIG. 7D). The HW Demux block, which is at the model-level, operates like the Multiport Switch block but in reverse. The one or more HW Demux blocks may be inserted on the output side of the single shared resource. The outputs from the deleted candidate blocks may be routed to the outputs of the one or more HW Demux blocks, as indicated at block 748. The outputs of the HW Demux blocks may be routed in the same manner as described above in connection with the Demux blocks. A Controller block also may be inserted into the model and operatively coupled to each of the one or more HW Demux blocks, as indicated at block 750.

The resource sharing optimizer 224 also may identify a shared region, e.g., a subgraph of the source model as modified, and configure this subgraph to operate at a faster rate as compared to the rest of the source model 300, as indicated at block 752. The faster rate of the subgraph, or more accurately the portion of the modified PIR corresponding to the subgraph, may be a function of the number of identical blocks that have been replaced by a single shared block. For example, if four blocks have been replaced by a single shared block, then the subgraph may be configured to run at a rate that is at least four times faster than its original rate. The shared region or subgraph may be identified by the resource sharing optimizer 224 as including: the shared block; and any block of the model where there exists a path from the shared block to this block and there is a path from this block to another shared block that is not the first shared block. In an embodiment, the subgraph does not have any loops or cycles.

It should be understood that, in the mutually parallel case, only the shared block may be operated at the faster rate.

As discussed above, the resource sharing process may differ depending on whether the candidate blocks are determined to be mutually parallel or data-dependent. In an embodiment, the resource sharing engine 224 may be configured to treat two blocks as mutually parallel, even if there exists a data connectivity between them. Specifically, the resource sharing engine 224 may be configured to determine if there is a delay block at the output of at least one of the two candidate blocks having the data connectivity. If not, a retiming technique, such as pipelining, may be applied in order to move an existing delay in the model to the output of at least one of the candidate blocks. In response to the existence of such a delay block, the resource sharing engine 224 may treat the two candidate blocks as mutually parallel, and apply the processing discussed above for mutually parallel candidate blocks. As part of the resource sharing processing, the resource sharing engine 224 or the delay balancing engine 226 removes, e.g., "consumes", the one or more delay blocks to account for the delay being introduced by sharing the resource.

In an embodiment, the resource sharing optimizer 224 is further configured to share a resource located within a feedback loop of the source graphical model.

Figure 12:
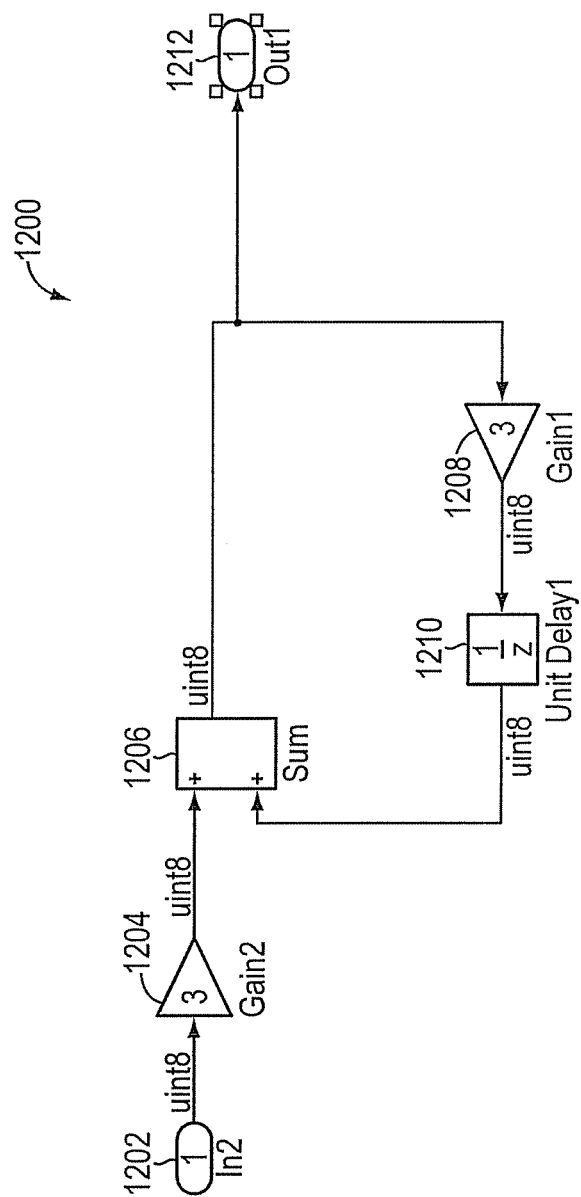
FIG. 12 is a schematic illustration of a feedback loop of a graphical program.

FIG. 12 is a schematic illustration of a feedback loop 1200 that may form or represent part of a source graphical model. The feedback loop 1200 includes an Inport block 1202, a first Gain block 1204, a Sum block 1206, a second Gain block 1208, a Delay block 1210, and an Outport block 1212. As shown, the output of the Sum block 1206, which leads to the Outport block 1212, also branches off to feed an input of the Sum block 1206 via the second Gain block 1208 and the Delay block 1210. The resource sharing optimizer 224 may be configured to share the two Gain blocks 1204, 1208, the second of which is located within a feedback loop.

A cycle in a dependency graph, such as a data dependency graph, may be considered a feedback loop. The dependencies may be algebraic or direct, or they may include delays or non-direct relations. The dependencies may have varying degrees of strictness such as, for example, a dependency that requires one block to always execute immediately following another block. A weaker dependency may require a block to execute following another block, but the sequence may possibly be interspersed by other blocks executing. Dependencies may be conditional and only enabled for certain values in the model.

Figure 13:
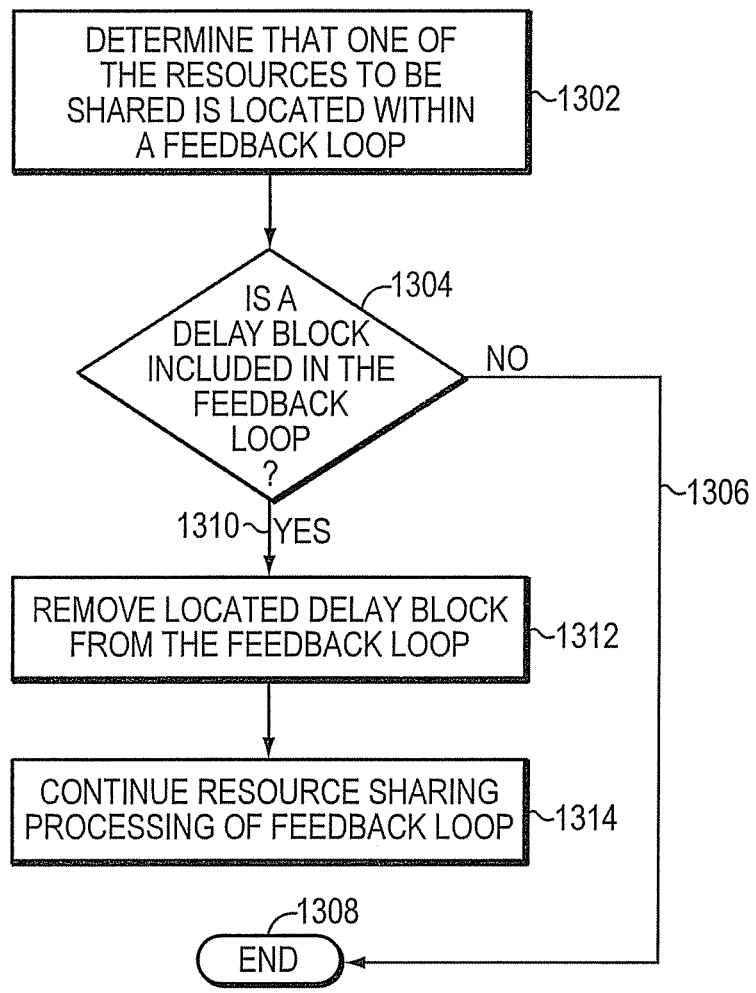
FIG. 13 is a flow diagram of a method in accordance with an embodiment of the present invention.

FIG. 13 is a flow diagram of an embodiment of additional steps that may be performed by the resource sharing optimizer 224 when including a resource located within a feedback loop as one of the resources being shared. The resource sharing optimizer 224 may determine based on its analysis of the PIR, that one of the resources to be shared is located within a feedback loop of the source graphical model, as indicated at block 1302. If so, the resource sharing optimizer 224 may determine whether a delay block is also present within the feedback loop at the output of the shareable resource, as indicated by decision block 1304. If not, a retiming technique may be applied to the model in order to move a delay that already exists somewhere else in the model to the output of the shareable resource. If no delay block is present at the output of the shared resource, and no existing delay block can be moved to that location, the resource sharing optimizer 224 may conclude that the resource within the feedback loop cannot be shared, as indicated by No arrow 1306 leading to end block 1308. If a delay block is located within the feedback loop, the resource sharing optimizer 224 may remove it, as indicated by Yes arrow 1310 leading to block 1312. The existing delay block is removed to account for the delay introduced as a result of the sharing process, and thus the latency of the feedback loop remains unchanged. After removing the delay block from the feedback loop, the sharing optimizer 224 may continue or resume the resource sharing process described above in connection with FIGS. 7A-E, as indicated at block 1314. For example, processing may continue at block 712 (FIG. 7A).

Figure 14:
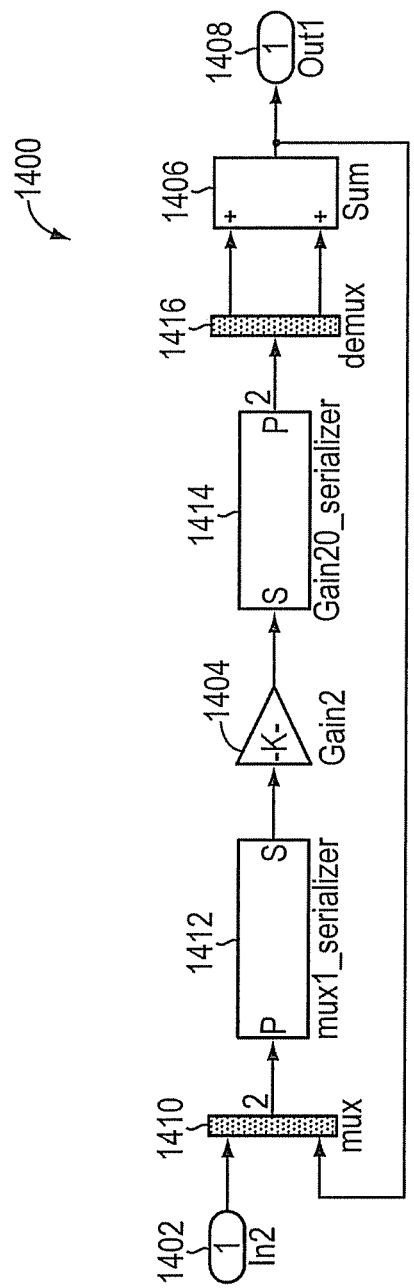
FIG. 14 is a schematic illustration of a validation model in accordance with an embodiment of the present invention.

FIG. 14 is a schematic illustration of a validation model 1400 generated for the feedback loop 1200 (FIG. 12). The validation model 1400 includes an Inport block 1402, a single Gain block 1404, a Sum block 1406, and an Outport block 1408. The validation model 1400 also includes a Mux block 1410, a Serializer block 1412, a Deserializer block 1414, and a Demux block 1416. As with the original feedback loop 1200, the output of the Sum block 1406, which feeds the Outport block 1408, also branches off and loops to an input of the Sum block 1406 via the Mux block 1410, the Serializer block 1412, the shared Gain block 1404, the Deserializer block 1414, and the Demux block 1416.

Note that the Delay block 1210 of the feedback loop 1200 has been removed, and is not present in the validation model 1400.

It should be understood that the feedback loop 1200 of FIG. 12 is intended for illustration purposes only, and that the resource sharing optimizer 224 may operate with other, possibly more complex, feedback loops.

In addition, the delay balancing engine 226 may cooperate with the resource sharing optimizer 224 to evaluate the PIR as it is being modified, to identify and account for, e.g., correct, any latencies or delays that have been introduced automatically, as indicated at block 754. In particular, a Delay block of the source model with a delay of $Z^{-k}$ may be expanded to have a delay of $Z^{-(k*Shf)}$, where Shf is the specified sharing factor. Furthermore, if a data-dependent path exists between two shared blocks that is solely combinational, i.e., the path is delay-less, then the delay balancing engine 226 may insert a delay at the end of the this path. This avoids the creation of an algebraic loop, which might cause a scheduling issue during execution or simulation in some technical computing environments. The delay balancing engine 226 thus ensures that merging paths in the source model remain aligned with each other. More specifically, the delay balancing engine 226 may automatically insert one or more Delay blocks in the source model and configure the inserted Delay blocks so as to return the data paths back into alignment. Specifically, the result of the resource sharing optimization process may be the introduction of two cycles of delay at the subgraph; one for the rate change operation to faster rates and the other for completing the execution of the shared subgraph. This delay of two cycles may be balanced at higher levels of the model.

As shown, the delay balancing engine 226 may balance or otherwise account for delays introduced in the source model 300 by the streaming or resource sharing engines 222, 224 without adding or requiring a handshake protocol to be implemented on any of the model's signals, data paths, control paths or communication channels. In an embodiment, the delay balancing engine 226 also does not add or implement a scheduler to any of the signals, data paths, control paths or communication channels of the source model 300. Similarly, the delay balancing engine 226 may not insert any new values, such as synchronization or absent values, to the data ranges of any of the model's signals, data paths, control paths or communication channels. As a result, such synchronization or absent values may not need to be added to the information contained in any source or input data blocks or files utilized by the source model 300. Likewise, such synchronization or absent values may not need to be removed from any sink or output data blocks or files of the source model 300.

Processing from block 732 (FIG. 7C), which dealt with the mutually parallel paths, may also continue at block 752, as indicated by from block 753 (FIG. 7D).

In an embodiment, the number of functionally equivalent blocks that are marked as candidate blocks for removal in place of a single, shared block by the resource sharing optimizer 224 is user-configurable. More specifically, the user may set the degree of sharing that is performed through the sharing factor. For example, in response to the user specifying a sharing factor of four, the resource sharing optimizer 226 may seek to replace groups of four functionally equivalent blocks with a single shared block. If the sharing factor is two, the sharing optimizer 224 may seek to replace groups of two functionally equivalent blocks with a single shared block. In those cases where there is a choice of which blocks to replace with a shared block, the sharing optimizer 224 may be configured to group and select those blocks that are most similar. The similarity may be determined based on block parameters, block input/output, and checksums of characteristics and functionality. For example, if there are four functionally equivalent Gain blocks, and two of them have the same gain parameter, then for a sharing factor of two, the two Gain block with the same gain parameter may be replaced as a group. The determination of similarity may be user configurable.

The process of identifying functionally equivalent blocks that may be shared and replacing these blocks with a single shared block may also be applied to subsystems. That is, if multiple subsystems are determined to be functionally equivalent or identical, and each subsystem is atomic, then the subsystems may all be replaced with a single shared subsystem. The process is the same as described above for blocks of the source model.

As with the streaming optimizer 222, a validation model may be generated from the source model, or more accurately the in-memory representation, as modified by the resource sharing optimizer 224 and the delay balancing engine 226, as indicated at block 756. The validation model may be presented to the user, as indicated at block 758.

Figure 8B:
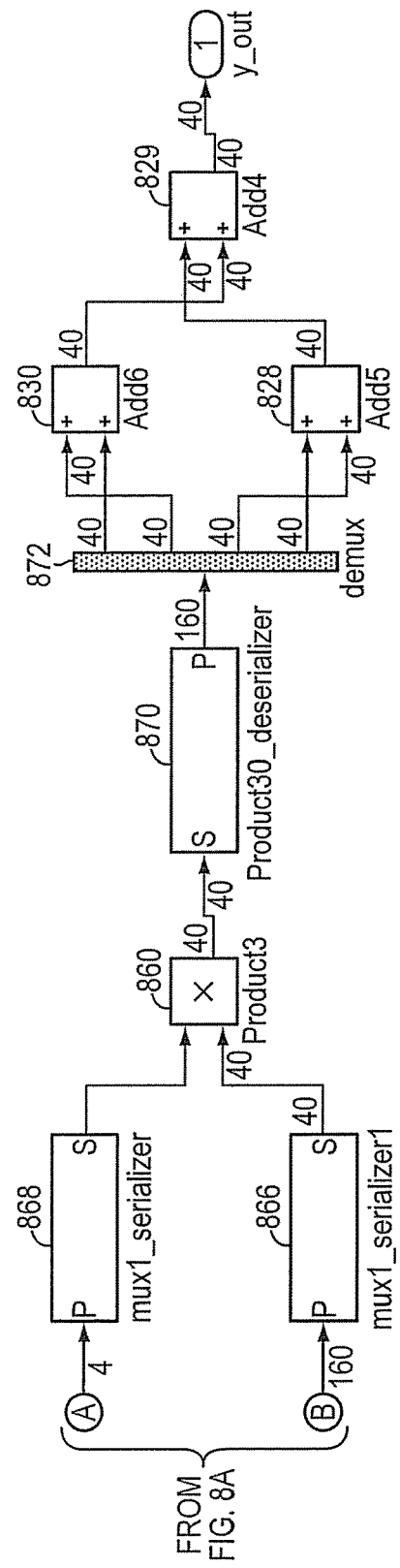

FIGS. 8A and 8B are partial views of a schematic illustration of a validation model 800 that represents an optimized version of the source model 300 in which the four Product blocks 332-335 have been replaced with a single shared Product block 860. FIG. 8 is a smaller scale view indicating the positions of FIGS. 8A and 8B to form a whole view. For source model 300, the resource sharing optimizer 224 determines that the four Product blocks 332-335 are fully parallel. Accordingly, the resource sharing optimizer 224 follows the sharing optimization process described above for fully parallel blocks.

Validation model 800 may be generated by the graphical model generator 216, and presented to the user, e.g., on the display 120. Like the source graphical model 300, the validation model 800 also has a scalar Inport block 802, four vector Inport blocks 804-810, a scalar Outport block 812, and a vector Outport block 814. Validation model 800 also includes eight Unit Delay blocks 815-822. Validation model 800 also includes seven Add blocks 824-830, and the one shared Product blocks 860. Validation model 800 also includes several other blocks that have been added as a result of the optimizations performed by the resource sharing optimizer 224, as described above in connection with FIGS. 7A-E. Specifically, a first Mux Block 862 receives as its inputs the Inports 804-810. A second Mux block 864 receives at its inputs signals from the Add blocks 824-827. A first Serializer block 866 receives the output of the first Mux block 862, and the output of the first Serializer block 866 is routed to one of the inputs of the one Product block 860 being shared. The first Serializer block 866 receives a 160-element wide vector from the first Mux block 862, and outputs a 40-element wide vector to the one Product block 860. A second Serializer block 868 receives the output of the second Mux block 864, and the output of the second Serializer block 868 is routed to the second input of the one Product block 860. The second Serializer block 868 receives a 4-element wide vector, and outputs a scalar. A Deserializer block 870 receives a 40-element wide vector from the one Product block 860, and outputs a 160-element wide vector to a Demux block 872 that has been added by the resource sharing optimizer 224. A Delay Matching block 874 has also been added.

The validation model 800 also may be used together with the source model 300 in a validation environment to test that the outputs produced by the validation model 800 are identical to the outputs produced by the source model 300 with necessary delays added to balance the outputs of the source model 800 with the outputs of the validation model 800.

Figure 7E:
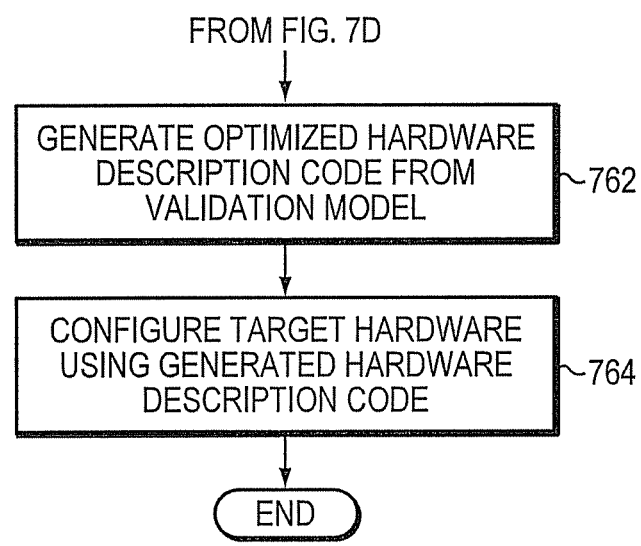

The report generator 221 may be directed to produce a report that describes or lists the resources that would be required to implement the validation model 800 in hardware, as indicated at block 760. Furthermore, if the user is satisfied with the operation of the validation model 800, and with the resource savings achieved by the resource sharing optimizer 224 (or the savings achieved by a combination of the streaming and resource sharing optimizers), the modified PIR may be used to generate optimized hardware description code, as indicated at block 762 (FIG. 7E). More specifically, the back-end processing unit 218 may interface with the IR generator 214 to generate optimized hardware description code from the modified PIR. This optimized hardware description code may be converted into a serial bit stream for synthesizing target hardware, as indicated at block 764.

Figure 9:
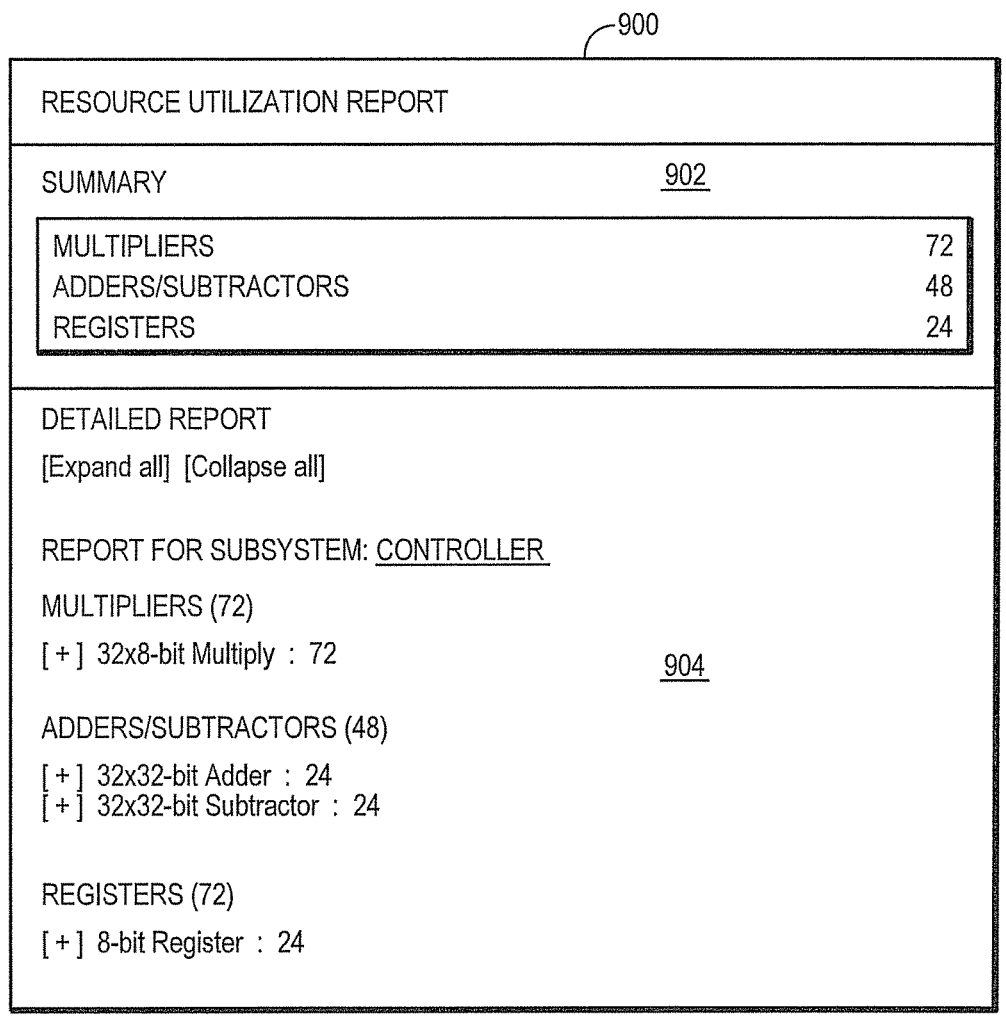
FIG. 9 is a schematic illustration of a resource report for a source model.

FIG. 9 is a schematic illustration of a resource report 900 produced by the report generator 221 for a source model. The report 900 may be presented to a user, e.g., on display 120. Report 900 may include a summary section 902 and a detailed section 904. The summary section 902 may list the number of hardware components needed to implement the source model, such as the number of multipliers, adders/subtractors, and registers, among other hardware components. The detailed section 904 may provide further information regarding these components, such as their sizes. As shown, to implement the source model in hardware, 72 multipliers, 48 adders/subtractors, and 24 registers are needed.

FIG. 10 is a schematic illustration of a resource report 1000 produced by the report generator 221 for an optimized version of the source model corresponding to FIG. 9. The source model may be optimized by the streaming optimizer, the resource sharing optimizer, or both. As shown, report 1000 also includes a summary section 1002, and a detailed section 1004. Following the optimizations described herein, implementation of the optimized version of the source model only requires three multipliers, and two adders. However, as shown, applying the optimizations described herein results in an increase in the number of registers that are required, i.e., from 24 for the source model corresponding to FIG. 9 to 210.

In an embodiment, the report may be automatically synchronized with user selected parameters for the optimization such as the sharing factor. For example, as one of the parameters, such as the streaming factor Sf or the sharing factor, is changed by the user, a report may automatically show how this change may affect the required resources, such as the number of registers required. For example, a parameter may be associated with a graphical slider bar, and a user may change the value of the parameter by moving the graphical slider bar within a range of possible values. This information may be displayed in a prominent location such as, for example, in a corner of the model canvas. The report may include information about alternate parameter choices, for example, as a table of parameter values, such as the streaming factor Sf or the sharing factor, and corresponding hardware resources that may be required for each respective parameter value. The report may be generated before the user commits to a choice of a parameter.

In an embodiment, the user may indicate a particular target hardware, and an indicator may be provided if the selected parameters for code generation might require more resources than available on the target hardware. In an embodiment, different combinations of parameter values may be automatically selected by an optimization algorithm to determine a combination of parameter values that does not require more than the resources that are available on the target hardware, or that satisfies a user specified optimization criterion.

It should be understood that reports 900, 1000 may be produced in a number of formats, such as a HyperText Markup Language (HTML) format for viewing with a browser application, a word processing format for viewing with a word processing application, a spreadsheet format for viewing with a spreadsheet application, a database format for viewing with a database application, etc.

It should also be understood that the optimizations performed by the streaming and resource sharing optimizers 222, 224 may both be applied to the same source model 300 to increase the level of optimization. For example, the streaming optimization process may be applied to the validation model 800 so that the 40-element wide vector at the one shared Product block 860 is converted into a scalar.

Figure 15:
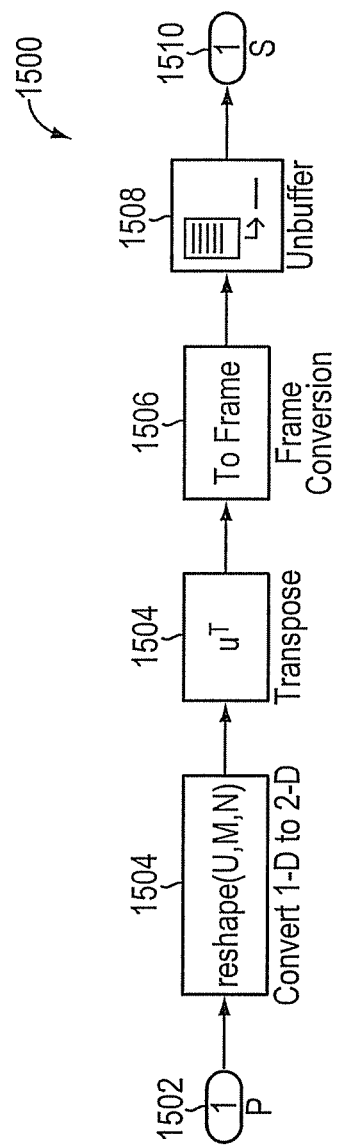
FIG. 15 is a schematic illustration of a Serializer subsystem.

In an embodiment, the Serializer and Deserializer blocks may each be implemented through an arrangement of blocks organized as a subsystem. FIG. 15 is a schematic illustration of a Serializer subsystem 1500, which includes a plurality of interconnected blocks. For example, the Serializer subsystem 1500 may have an Inport block 1502 that receives, e.g., the vector input, and a Convert 1-D to 2-D block 1504 that reshapes a received vector or matrix to a vector or matrix of a specified size. The Serializer subsystem 1500 also may include a Transpose block 1504 that transposes an M-by-N input matrix to an N-by-M output matrix, and a To Frame Conversion block 1506 changes the sampling mode from sample-based to frame-based. The Serializer subsystem 1500 may include an Unbuffer block 1508 that unbuffers an input matrix row-wise so that each row of the input matrix becomes an independent time-sample in the output. Finally, the Serializer subsystem 1500 may include an Outport block 1510 that provides the, e.g., serialized, output.

Figure 16:
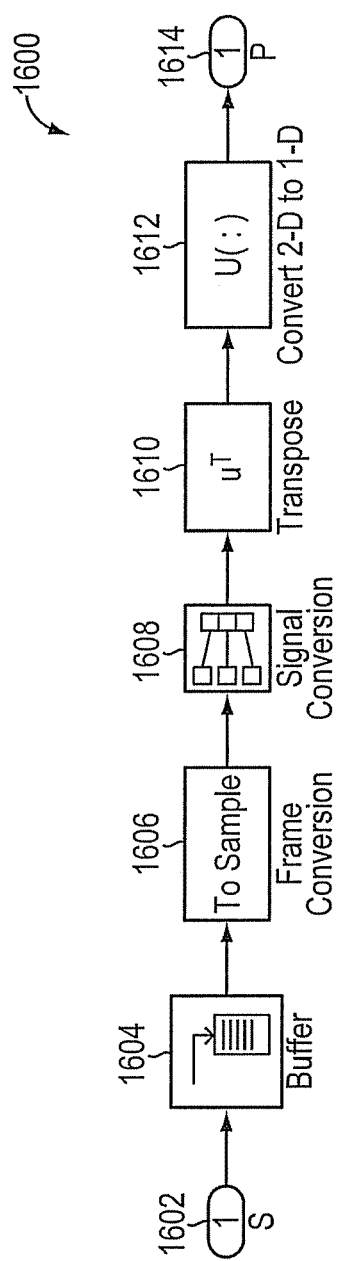
FIG. 16 is a schematic illustration of a Deserializer subsystem.

FIG. 16 is a schematic illustration of a Deserializer subsystem 1600, which includes a plurality of interconnected blocks. For example, the Deserializer subsystem 1600 may have an Inport block 1602 that receives, e.g., the serial input, and a Buffer block 1604 that redistributes data in each column of an input frame to produce an output with a different frame size than the input, for example, a larger size at a slower rate. The Deserializer subsystem 1600 also may include a To Sample Conversion block 1606 that changes the sampling mode from frame-based to sample-based. The Deserializer subsystem 1600 may include a Signal Conversion block 1608 that stores elements in contiguous memory. The Deserializer subsystem 1600 may further include a Transpose block 1610 that transposes an M-by-N input matrix to an N-by-M output matrix. The Deserializer subsystem 1600 may include a Convert 2-D to 1-D block that reshapes a matrix input to a 1-D vector. Finally, the Deserializer subsystem 1600 may include an Outport block 1614 that provides the, e.g., parallel, output.

Alternatively, the Serializer and Deserializer blocks may be implemented through code blocks, such as the Embedded MATLAB function block of the Simulink product. More specifically, MATLAB code may be written to implement the Serializer and Deserializer functionality, for example, the functionality illustrated in FIGS. 15 and 16, and this code may be associated with respective Embedded MATLAB function blocks.

In a further embodiment, the Serializer and Deserializer blocks may represent corresponding hardware descriptions that may be utilized during code generation. Those skilled in the art will understand that the Serializer and Deserializer blocks may be implemented in other ways.

Figure 17:
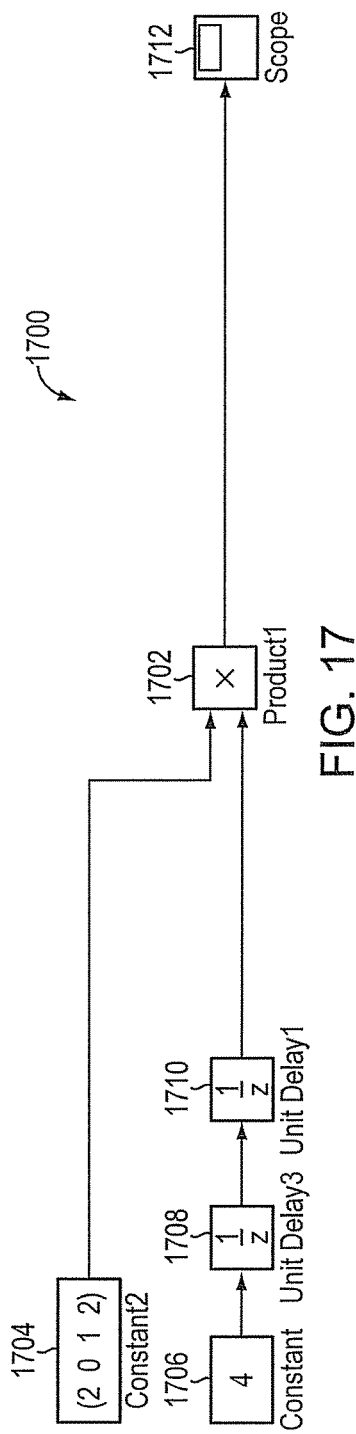
FIG. 17 is a schematic illustration of a portion of a source graphical model.

In an embodiment, the streaming optimizer may be further configured to perform additional optimizations as a function of data values within the source graphical model, such as constant values, and/or in the data being input to the source model. FIG. 17 is a schematic illustration of a portion 1700 of a source graphical model. The model portion 1700 includes a Product block 1702 that has as a first input the output of a Constant block 1704, and as a second input the output produced by a sequence of blocks, e.g., a second Constant block 1706 and two Unit Delay blocks 1708, 1710, whose initial condition values may be set to different values. The output of the Product block 1702 may be provided to a Scope block 1712.

The streaming optimizer may be configured to examine fixed or otherwise known values being input to one or more pre-selected blocks, such as Product blocks. If the input values include a 1 or 0, then the output of the Product is known in advance, and the output value need not be computed by the Product block. The streaming optimizer may take this information into consideration when generating the Serializer and Deserializer blocks associated with the subject Product block.

Figure 18:
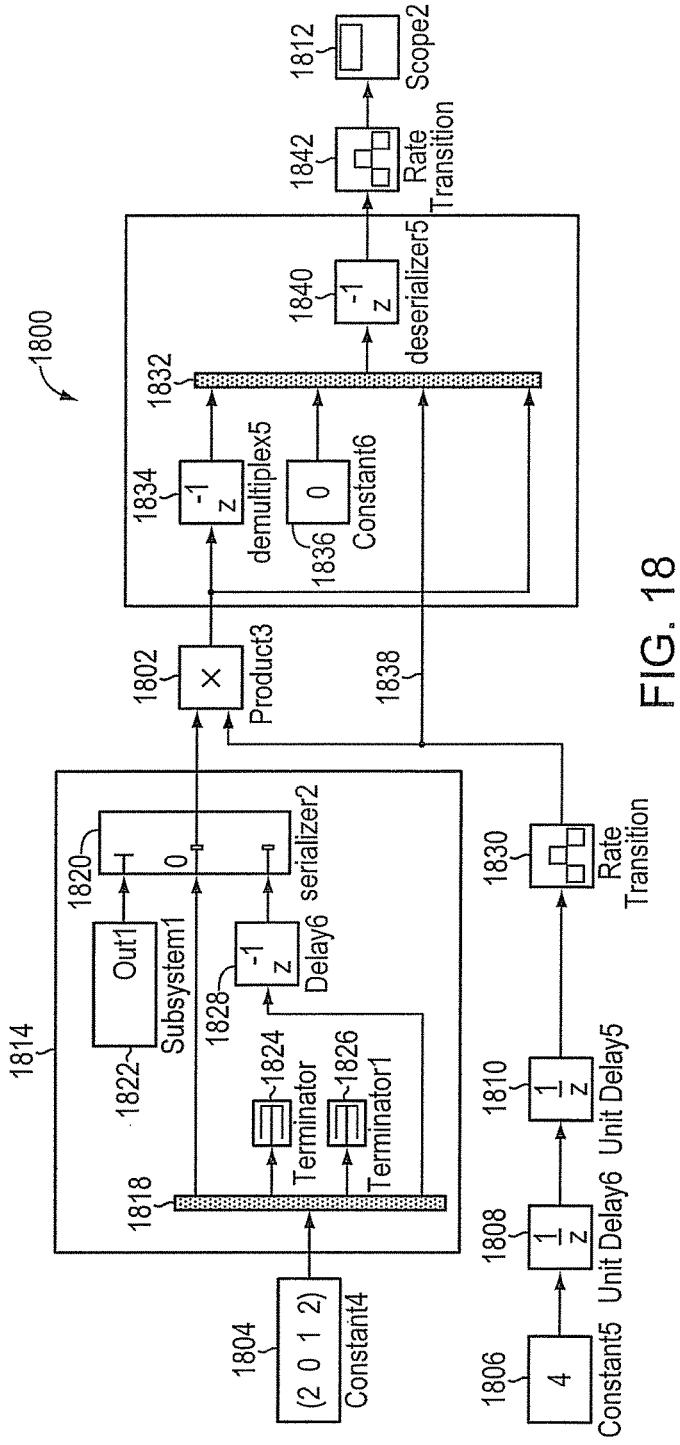
FIG. 18 is a schematic illustration of a validation model.

FIG. 18 is a schematic illustration of a portion 1800 of a code generation model generated for the streaming optimizer for the portion 1700 of the source model. The code generation portion 1800 includes a Product block 1802, a first Constant block 1804, a second Constant block 1806, two Unit Delay blocks 1808, 1810, and a Scope block 1812. The code generation portion 1800 also includes a Serializer subsystem 1814 and a Deserializer subsystem 1816. The Serializer subsystem 1814 includes a Demux block 1818 and a Multiport switch block 1820 that is controlled by a Controller block 1822, which may be a counter. The outputs of the Demux block 1818 that correspond to the 0 and 1 values of the first Constant block 1804 are fed to Terminator blocks 1824, 1826, because these values do not need to be provided to the Product block 1802, as they have no effect on the output computed by the Product block 1802. The Serializer subsystem 1814 may also include a Delay block 1828 associated with the last value of the first Constant block 1804. The output of the Multiport Switch block 1820 is provided as an input to Product block 1802. A Rate Transition block 1830 may also be inserted into the code generation portion 1800 to receive the data values from the second Constant and Unit Delay blocks 1806, 1808, 1810, and provide those values to the other input of the Product block 1802.

The Deserializer subsystem 1816 may include a Mux block 1832 that receives the output computed by the Product block 1802. Specifically, the Mux block receives the first and fourth output values computed by the Product block 1802. The first output value may be delayed by a Delay block 1834. As described above, the second and third values of the first Constant block 1804 are not provided to the Product block 1802. Instead, the streaming optimizer configures the Mux block 1832 to receive a 0 value for the second output of the Product block 1832 through third Constant block 1836. In addition, the streaming optimizer configures Serializer and Deserializer subsystems 1814, 1816 so that the values from blocks 1806, 1808, 1810 are delivered directly to the Mux block 1832, for example, by signal line 1838, by-passing the Product block 1802 entirely. The Deserializer subsystem 1816 may also include a Delay block 1840. Another Rate Transition block 1842 may be inserted into the code generation portion 1800 to between the Deserializer subsystem 1816 and the scope block 1812.

It should be understood that the Serializer and Deserializer subsystems 1814, 1816 may also include the Rate Transition blocks 1830, 1742, respectively.

As shown, instead of computing four output values, the Product block 1802 of the code generation model portion 1800 only computes two output values. As a result, while the streaming optimizer configures the Product blocks 1802 and the Serializer and Deserializer subsystems 1814, 1816 to operate at a higher clock rate than the time step of model portion 1700, this higher clock rate may not be as fast as would otherwise be required if the Product block were computing four outputs.

Other components may be used to implement the Serializer and Deserializer subsystems.

Similar optimizations may be implemented by the streaming optimizer for other blocks besides Product blocks. For example, similarly optimizations may be implemented for Add and Subtraction blocks that receive 0 as input values, and for Divide blocks that receive 1 as in input value.

In addition to examining values within the source graphical model, the streaming optimizer may be configured to examine values of input data to the graphical model. For example, an input to a source model may be a sparse matrix that has mostly 0 values. In this case, the streaming optimizer may be configured to implement the increased optimization described above. Such a sparse matrix may, for example, correspond to one or more image files taken in low light conditions.

The foregoing description has been directed to specific embodiments of the present invention. It will be apparent, however, that other variations and modifications may be made to the described embodiments, with the attainment of some or all of their advantages. For example, the streaming or sharing factors may be determined programmatically. Therefore, it is the object of the appended claims to cover all such variations and modifications as come within the true spirit and scope of the invention.

What is claimed is:

1. A method comprising:
   storing, in a memory, a first intermediate representation of at least a portion of an executable source model including a plurality of model blocks arranged on data paths;
   automatically revising, by a processor coupled to the memory, the first intermediate representation to produce a second intermediate representation of the at least a portion of the executable source model, the second intermediate representation optimized for a hardware implementation of the at least a portion of the executable source model, the automatically revising resulting in one or more delays being introduced into the second intermediate representation;
   automatically modifying, by the processor, the second intermediate representation to correct for the one or more delays introduced into the second intermediate representation, the automatically modifying including:
   identifying a join point in the second intermediate representation where two of the data paths merge;
   computing sums of delays for the two data paths at the join point;
   comparing the sums of delays for the two data paths; and
   when the sums of delays are unequal, inserting a first delay element into one of the two data paths, the first delay element configured such that the sums of delays are equal, the automatically modifying producing a third intermediate representation of the at least a portion of the executable source model;
   generating from the third intermediate representation a hardware description language (HDL) description of the at least a portion of the executable source model; and
   configured one or more target hardware elements based on the HDL description.

2. The method of claim 1 wherein the two data paths have different rates, the automatically modifying further including:

normalizing the different rates of the two data paths before the computing.

3. The method of claim 2 wherein the rates of the two data paths are based on at least one of sample rates, time steps, or event steps.

4. The method of claim 1 further comprising:
identifying a rate transition boundary in the second intermediate representation; and
inserting a second delay element at the rate transition boundary.

5. The method of claim 4 wherein the rate transition boundary occurs at an upsample element or a downsample element of the at least a portion of the executable source model.

6. The method of claim 4 further comprising:
configuring the second delay element to provide a delay given by:

$K-(N \% K)$, where

N is a number of new delays introduced at the rate transition boundary,
% is a modulo operation, and
K is a rate transition factor.

7. The method of claim 1 wherein the executable source model is a textual model, a graphical model, or a combination textual-graphical model.

8. The method of claim 1 wherein the automatically revising includes at least one of a resource sharing optimization, a streaming optimization, and a pipelining optimization to the first intermediate representation.

9. The method of claim 1 wherein the at least a portion of the executable source model includes a given data path of the data paths, the given data path including a first vector width, and the automatically revising includes:
converting at least a portion of the given data path from the first vector width to a scalar or a second vector width, where the second vector width is smaller than the first vector width.

10. One or more non-transitory, computer-readable media including instructions executable by a processor, the instructions comprising instructions for:
storing, in a memory, a first in-memory representation of at least a portion of an executable source model including a plurality of model blocks arranged on data paths;
automatically revising, by a processor coupled to the memory, the first in-memory representation to produce a second in-memory representation of the at least a portion of the executable source model, the second in-memory representation optimized for a hardware implementation of the at least a portion of the executable source model, the automatically revising resulting in one or more delays being introduced into the second in-memory representation;
automatically modifying, by the processor, the second in-memory representation to correct for the one or more delays introduced into the second intermediate representation, the automatically modifying including:
identifying a join point in the second in-memory representation where two of the data paths merge;
computing sums of delays for the two data paths at the join point;
comparing the sums of delays for the two data paths; and
when the sums of delays are unequal, inserting a first delay element into one of the two data paths, the first delay element configured such that the sums of delays are equal, the automatically modifying producing a third in-memory representation of the at least a portion of the executable source model; and
generating from the third in-memory representation a hardware description language (HDL) description of the at least a portion of the executable source model; and
configured one or more target hardware elements based on the HDL description.

11. The one or more non-transitory, computer-readable media of claim 10 wherein the two data paths have different rates, the automatically modifying further including:
normalizing the different rates of the two data paths before the computing.

12. The one or more non-transitory, computer-readable media of claim 11 wherein the rates of the two data paths are based on at least one of sample rates, time steps, or event steps.

13. The one or more non-transitory, computer-readable media of claim 10 further comprising instructions for:
identifying a rate transition boundary in the second in-memory representation; and
inserting a second delay element at the rate transition boundary.

14. The one or more non-transitory, computer-readable media of claim 13 wherein the rate transition boundary occurs at an upsample element or a downsample element of the at least a portion of the executable source model.

15. The one or more non-transitory, computer-readable media of claim 13 further comprising instructions for:
configuring the second delay element to provide a delay given by:

$K-(N \% K)$, where

N is a number of new delays introduced at the rate transition boundary,
% is a modulo operation, and
K is a rate transition factor.

16. The one or more non-transitory, computer-readable media of claim 10 wherein the executable source model is a textual model, a graphical model, or a combination textual-graphical model.

17. The one or more non-transitory, computer-readable media of claim 10 wherein the automatically revising includes at least one of a resource sharing optimization, a streaming optimization, and a pipelining optimization to the first in-memory representation.

18. The one or more non-transitory, computer-readable media of claim 10 wherein the at least a portion of the executable source model includes a given data path of the data paths, the given data path including a first vector width, and the instructions for automatically revising include instructions for:
converting at least a portion of the given data path from the first vector width to a scalar or a second vector width, where the second vector width is smaller than the first vector width.

19. An apparatus comprising:
a memory storing a first intermediate representation of at least a portion of an executable source model including a plurality of model blocks arranged on data paths; and
a processor coupled to the memory, the processor configured to:
automatically revise the first intermediate representation to produce a second intermediate representation of the at least a portion of the executable source model, the second intermediate representation optimized for a hardware implementation of the at least a portion of the executable source model, the automatically revising resulting in one or more delays being introduced into the second intermediate representation;

automatically modify the second intermediate representation to correct for the one or more delays introduced into the second intermediate representation, the automatically modifying including:

identify a join point in the second intermediate representation where two of the data paths merge;

compute sums of delays for the two data paths at the join point;

compare the sums of delays for the two data paths; and when the sums of delays are unequal, insert a first delay element into one of the two data paths, the first delay element configured such that the sums of delays are equal, the automatically modifying producing a third intermediate representation of the at least a portion of the executable source model; and generate from the third intermediate representation code for the at least a portion of the executable source model; and configured one or more target hardware elements based on the code.

20. The apparatus of claim 19 wherein the two data paths have different rates, the processor further configured to:
normalize the different rates of the two data paths before the computing.

21. The apparatus of claim 20 wherein the rates of the two data paths are based on at least one of sample rates, time steps, or event steps.

22. The apparatus of claim 19 wherein the processor is further configured to:
identify a rate transition boundary in the second intermediate representation; and
insert a second delay element at the rate transition boundary.

23. The apparatus of claim 19 wherein the automatically revising includes at least one of a resource sharing optimization, a streaming optimization, and a pipelining optimization to the first intermediate representation.

* * * * *

UNITED STATES PATENT AND TRADEMARK OFFICE
CERTIFICATE OF CORRECTION

PATENT NO. : 10,248,390 B1
APPLICATION NO. : 14/993773
DATED : April 2, 2019
INVENTOR(S) : Girish Venkataramani et al.

Page 1 of 2

It is certified that error appears in the above-identified patent and that said Letters Patent is hereby corrected as shown below:

In the Claims

Claim 1:
Column 30, Line 63:
Delete "configured one or more target hardware elements based"
Insert --configuring one or more target hardware elements based--

Claim 10:
Column 31, Line 40:
Delete "including instructions executable by a processor, the instruc-"
Insert --including instructions executable by one or more processors, the instruc- --

Column 31, Line 45:
Delete "automatically revising, by a processor coupled to the"
Insert --automatically revising, by the one or more processors one or more of which is coupled to the--

Column 31, Line 54:
Delete "automatically modifying, by the processor, the second"
Insert --automatically modifying, by the one or more processors, the second--

Column 32, Line 7:
Delete "configured one or more target hardware elements based"
Insert --configuring one or more target hardware elements based--

Claim 19:
Column 32, Line 61:
Delete "a processor coupled to the memory, the processor con-"
Insert --one or more processors one or more of which is coupled to the memory, the one or more processors con- --

Signed and Sealed this
    Seventeenth Day of March, 2020

Andrei Iancu
*Director of the United States Patent and Trademark Office*

CERTIFICATE OF CORRECTION (continued)
U.S. Pat. No. 10,248,390 B1

Column 34, Line 1:
Delete "configured one or more target hardware elements based"
Insert --configure one or more target hardware elements based--

Claim 20:
Column 34, Line 4:
Delete "have different rates, the processor further configured to:"
Insert --have different rates, the one or more processors further configured to:--